United States Patent [19]
Takahashi

[11] Patent Number: 6,008,518
[45] Date of Patent: Dec. 28, 1999

[54] TRANSISTOR AND METHOD OF MANUFACTURING THE SAME

[75] Inventor: Hideki Takahashi, Tokyo, Japan

[73] Assignee: Mitsubishi Denki Kabushiki Kaisha, Tokyo, Japan

[21] Appl. No.: 09/068,113

[22] PCT Filed: Sep. 6, 1996

[86] PCT No.: PCT/JP96/02557

§ 371 Date: May 6, 1998

§ 102(e) Date: May 6, 1998

[87] PCT Pub. No.: WO98/10469

PCT Pub. Date: Mar. 12, 1998

[51] Int. Cl.[6] .................................... H01L 29/72
[52] U.S. Cl. ............... 257/326; 257/328; 257/378; 257/401; 438/156; 438/212; 438/234; 438/268; 438/585
[58] Field of Search ..................... 257/326, 328, 257/378, 401; 438/156, 212, 234, 268, 585

[56] References Cited

U.S. PATENT DOCUMENTS 5,751,024  5/1998  Takahashi ................. 257/139

FOREIGN PATENT DOCUMENTS 59-4168   1/1984  Japan .
62-63470  3/1987  Japan .

*Primary Examiner*—Edward Wojciechowicz
*Attorney, Agent, or Firm*—Oblon, Spivak, McClelland, Maier & Neustadt, P.C.

[57] ABSTRACT

A transistor and a fabrication method thereof, and in particular, a technique for compatibly improving reduction of an ON-state voltage and reduction of a turn-off time. First and second emitter layers are selectively formed in isolation from each other on a surface of a base layer 3, and a channel region 6 opposed to a gate electrode 8 through a gate insulating film is formed therebetween. In an ON state, a base current $I_b$ is supplied from a base electrode, while a prescribed gate voltage is applied to the gate electrode. The first and second emitter layers couple with each other and function as a single emitter layer, whereby the ON-state voltage becomes a low value of about the same degree as a bipolar transistor. When bringing a device into an OFF state, supply of the base current $I_b$ is stopped while a zero (or negative) voltage is applied to the gate electrode. Consequently, coupling between the first emitter layer and the second emitter layer is canceled, whereby a second collector current $I_{c2}$ which is a component of a main current passing through the second emitter layer rapidly attenuates similarly to a MOS.

20 Claims, 29 Drawing Sheets

F I G. 2 0
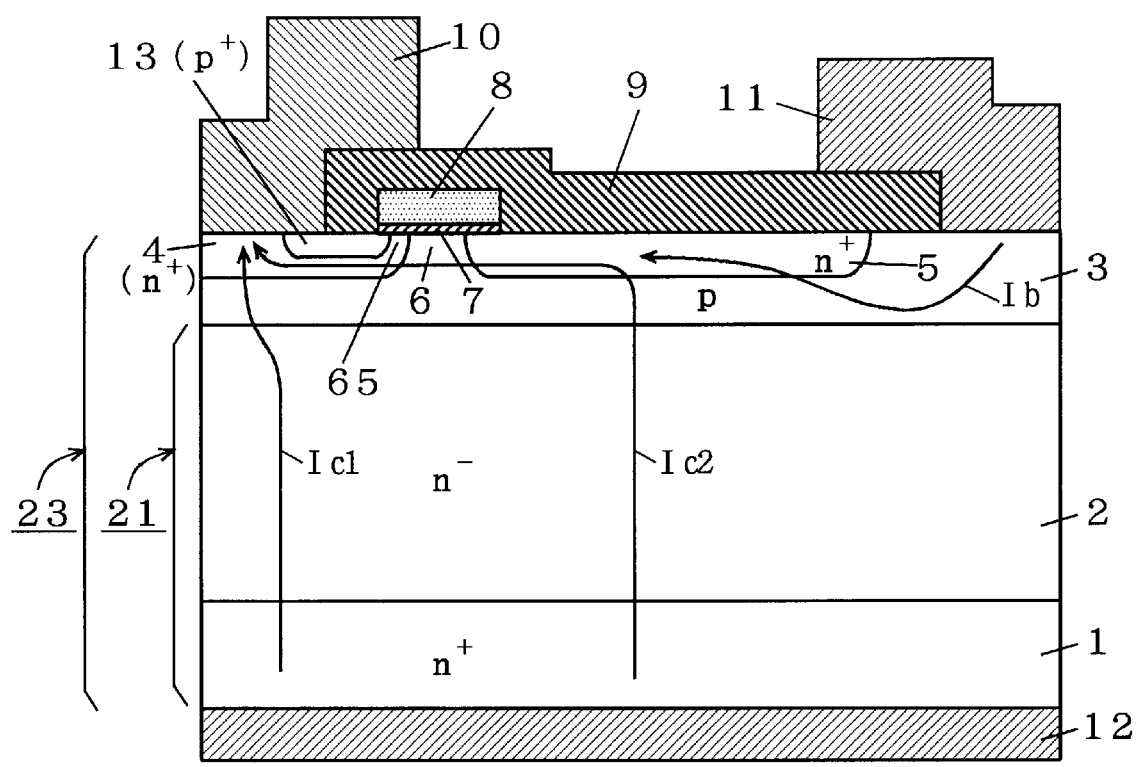

TRANSISTOR AND METHOD OF MANUFACTURING THE SAME

BACKGROUND OF THE INVENTION

1. Field of the Invention

The present invention relates to a transistor and a method of fabricating the same, and more particularly, it relates to an improvement for compatibly improving an output characteristic and an OFF characteristic.

2. Discussion of the Background

In general, a MOSFET (hereinafter simply referred to as MOS) has been mainly employed in a region having a rated voltage of not more than 200 V and a bipolar transistor (hereinafter simply referred to as BIP) or an insulated gate bipolar transistor (hereinafter simply referred to as IGBT) has been employed in a region of at least 300 V in various types of power transistors (power transistors). The respective ones of the conventional MOS, BIP and IGBT are now described.

FIG. 37 is a sectional view showing the structure of the conventional MOS. This MOS 151 corresponds to an example of the so-called vertical MOS. As shown in FIG. 37, an n⁻ layer 172 is formed on an N⁺ layer 171 in the MOS 151, and p-type base layers 173 are selectively formed in an upper surface part of the n⁻ layer 172 by diffusing a p-type impurity. Further, n-type source regions 174 are selectively formed in upper surface parts of the base layers 173 by diffusing an n-type impurity. The source layers 174 are partially arranged in single base layers 173, and the impurity concentrations thereof are set higher than the n⁻ layer 172.

A gate oxide film 177 is formed on an exposed surface of the n⁻ layer 172 and exposed surfaces of the base layers 173 held between the n⁻ layer 172 and the source layers 174, and a gate electrode 178 made of polysilicon is formed further on this gate oxide film 177. Parts of the base layers 173 opposed to the gate electrode 178 through the gate oxide film 177 function as channel regions 176.

A source electrode 180 is formed on the exposed surfaces of the base layers 173 excluding the channel regions 176, i.e., upper surfaces of regions held between the source layers 174. The source electrode 180 and the gate electrode 178 are typically isolated from each other by an interlayer isolation film 179. Further, a drain electrode 182 is formed on an exposed surface of the N⁺ layer 171. These source electrode 180 and drain electrode 182 form a pair of main electrodes functioning as paths of a main current.

This MOS 51 operates as follows: First, a drain voltage $V_{DS}$ of prescribed magnitude is applied between the drain electrode 182 and the source electrode 180, so that the side of the drain electrode 182 is positive. When applying a gate voltage $V_{GE}$ (i.e., turning on a gate) exceeding a gate threshold voltage $V_{GE}(th)$ between the gate electrode 178 and the source electrode 180 so that the side of the gate electrode 178 is positive in this state, the p-type channel regions 176 are inverted to an n type and n-type channels are formed in the channel regions 176. Consequently, the n⁻ layer 172 and the source layers 174 conduct with each other, whereby the drain electrode 182 and the source electrode 180 conduct with each other. Namely, the MOS 151 enters an ON state.

Then, when inverting the gate voltage $V_{GE}$ from the positive value to the value of zero or a negative (reverse bias) value (i.e., turning off the gate) in the state applying the drain voltage $V_{DS}$, the channel regions 176 having been inverted to the n type return to the original p type. Consequently, the n⁻ layer 172 and the source layers 174 are disconnected from each other, whereby the drain electrode 182 and the source electrode 180 are disconnected from each other. Namely, the MOS 151 enters an OFF state.

FIG. 38 is a sectional view showing the structure of the conventional BIP. In this BIP 152, an n⁻ layer 202 is formed on an N⁺ layer 201, and a p-type base layer 203 is formed on an upper surface of the n⁻ layer 202 by diffusing a p-type impurity. Further, an n-type emitter layer 204 is selectively formed in an upper surface part of the base layer 203 by diffusing an n-type impurity. The impurity concentration of the emitter layer 204 is set higher than the n⁻ layer 202.

An emitter electrode 210 and a base electrode 211 are formed on exposed surfaces of the emitter layer 204 and the base layer 203 respectively, and a collector electrode 212 is formed on an exposed surface of the N⁺ layer 201. The collector electrode 212 and the emitter electrode 210 function as a pair of main electrodes.

This BIP 152 operates as follows: First, a collector voltage $V_{CE}$ of prescribed magnitude is applied between the collector electrode 212 and the emitter electrode 210 so that the side of the collector electrode 212 is positive. When supplying a base current from the base electrode 211 in this state, the diffusion potential of the base layer 203 is relaxed or canceled. Consequently, the collector electrode 212 and the emitter electrode 210 conduct with each other. Namely, the BIP 152 enters an ON state.

Then, when stopping supply of the base current in the state applying the collector voltage $V_{CE}$, the diffusion potential of the base layer 203 revives. Consequently, the collector electrode 212 and the emitter electrode 210 are disconnected from each other. Namely, the BIP 152 enters an OFF state.

FIG. 39 is a sectional view showing the structure of the conventional IGBT. In this IGBT 153, an N⁺ buffer layer 311 is formed on a p⁺ layer 301, and an n⁻ layer 302 is formed on the N⁺ buffer layer 311. Further, p-type base layers 303 are selectively formed in an upper surface part of the n⁻ layer 302 by diffusing a p-type impurity. In addition, n-type emitter layers 304 are selectively formed in upper surface parts of the base layers 303 by diffusing an n-type impurity. The emitter layers 304 are partially arranged in single base layers 303, and the impurity concentrations thereof are set higher than the n⁻ layer 302.

A gate oxide film 307 is formed on an exposed surface of the n⁻ layer 302 and exposed surfaces of the base layers 303 held between the n⁻ layer 302 and the emitter layers 304, and a gate electrode 308 made of polysilicon is formed further on this gate oxide film 307. Parts of the base layers 303 opposed to the gate electrode 308 through the gate oxide film 307 function as channel regions 306.

An emitter electrode 310 is formed on exposed surfaces of the base layers 303, i.e., upper surfaces of regions held between the emitter layers 304. The emitter electrode 310 and the gate electrode 308 are electrically isolated from each other by an interlayer isolation film 309. A collector electrode 312 is formed on an exposed surface of the p⁺ layer 301. These emitter electrode 310 and collector electrode 312 form a pair of main electrodes functioning as paths for a main current.

As hereinabove described, the IGBT 153 has such a structure that the N⁺ layer 201 is just replaced with a two-layer structure formed by the p⁺ layer 301 and the N⁺ buffer layer 311 in the MOS 151.

This IGBT 153 operates as follows: First, a collector voltage $V_{CE}$ of prescribed magnitude is applied between the collector electrode 312 and the emitter electrode 310 so that the side of the collector electrode 312 is positive. When applying a gate voltage $V_{GE}$ exceeding a gate threshold voltage $V_{GE}$(th) (turning on a gate) so that the side of the gate electrode 308 is positive, the p-type channel regions 306 are inverted to an n type and n-type channels are formed in the channel regions 306.

Through these channels, electrons are injected from the emitter electrode 310 into the n⁻ layer 302. The p⁺ layer 301 and the n⁻ layer 302 (including the N⁺ buffer layer 311) are forward-biased by the injected electrons, and holes are injected from the p⁺ layer 301. Consequently, the resistance of the n⁻ layer 302 remarkably lowers, and a large main current flows from the collector electrode 312 to the emitter electrode 310. Namely, the IGBT 153 enters an ON state. Thus, the IGBT 153 lowers the resistance of the n⁻ layer 302 by injection of the holes from the p⁺ layer 301.

Then, when inverting the gate voltage $V_{GE}$ from the positive value to the value of zero or a negative (reverse bias) value (turning off the gate) in the state applying the collector voltage $V_{CE}$, the channel regions 306 having been inverted to the n type return to the original p type. Consequently, the injection of the electrons from the emitter electrode 310 into the n⁻ layer 302 stops. Following this, the injection of the holes from the p⁺ layer 301 into the n⁻ layer 302 also stops. Thereafter the electrons and the holes having been stored in the n⁻ layer 302 (including the N⁺ buffer layer 311) escape toward the collector electrode 312 and the emitter electrode 310 respectively, or disappear by coupling with each other. Thus, the IGBT 153 enters an OFF state.

As hereinabove described, each of the MOS 151, the BIP 152 and the IGBT 153 controls the main current in response to the voltage or the current applied to a control electrode (i.e., the gate electrode or the base electrode).

These three types of transistors had characteristics described below. FIG. 40 is a graph showing output characteristics of these three types of transistors with rated voltages in the range of about 200 V to about 500 V. Referring to FIG. 40, the horizontal axis corresponds to the voltages (i.e., the collector voltages $V_{CE}$) between the pairs of main electrodes, and the vertical axis corresponds to the main currents. In the MOS 151, an ON-state voltage rises when the main current increases. Further, such a point that the magnitude of the main current is small as compared with the remaining transistors is characteristic.

In the IGBT 153, the main current is large, while such a characteristic is recognized that an ON-state voltage in the low current range is large. On the other hand, the BIP 152 exhibits such a characteristic that the main current is large and moreover an ON-state voltage is low. Namely, it can be said that the BIP 152 is most excellent in relation to the output characteristics.

FIG. 41 is a graph showing turn-off characteristics of the three types of transistors similarly with rated voltages in the range of about 200 V to about 500 V. Referring to FIG. 41, the horizontal axis corresponds to elapsed times, and the vertical axis corresponds to the magnitude of the main currents in the process of transition from ON states to OFF states. In the BIP 152 which is most excellent in the output characteristics, the turn-off time lengthens to about 10 times the MOS 151. Comparing the MOS 151 and the IGBT 153 with each other, there is no large difference although the turn-off time of the MOS 151 is short to some extent.

As hereinabove described, there has been such a problem that the ON-state voltages are high in the MOS and the IGBT, and there has been such a problem that the turn-off time is long in the BIP among the conventional three types of power transistors. A transistor whose ON-stage voltage is low, which is simultaneously excellent in turn-off characteristic has not been known in general.

SUMMARY OF THE INVENTION

A device of a first invention is characterized in comprising a first conductivity type first semiconductor layer defining a first major surface and a second major surface, a second conductivity type second semiconductor layer formed in the first major surface of the first semiconductor layer, a first conductivity type third semiconductor layer selectively formed in a surface of the second semiconductor layer, a first conductivity type fourth semiconductor layer selectively formed in the surface of the second semiconductor layer and in isolation from the third semiconductor layer, an insulating film formed on a region held between the third and fourth semiconductor layers in an exposed surface of the second semiconductor layer, a first control electrode formed in the insulating film, a second control electrode formed on a region in the exposed surface of the second semiconductor layer different from the region on which the insulating film is formed, a first main electrode formed on a surface of the third semiconductor layer, and a second main electrode formed on the second major surface of the first semiconductor layer in a transistor.

A device of a second invention is characterized in that the first main electrode and the second control electrode are so formed as to hold the first control electrode and the fourth semiconductor layer therebetween in the transistor of the first invention.

A device of a third invention is characterized in that the third and fourth semiconductor layers are formed in the shape of stripes, and to be parallel to each other in the transistor of the first or second invention.

A device of a fourth invention is characterized in that a first component not flowing through the fourth semiconductor layer is suppressed lower than a second component flowing through the fourth semiconductor layer in the main current flowing across the first and second main electrodes in the transistor of any of the first to third invention.

A device of a fifth invention is characterized in that the fourth semiconductor layer is formed more deeply than the third semiconductor layer in the transistor of the fourth invention.

A device of a sixth invention is characterized in that a second conductivity type fifth semiconductor layer is higher in impurity concentration than the second semiconductor layer is formed adjacently to a bottom portion of the third semiconductor layer in the transistor of the fourth or fifth invention.

A device of a seventh invention is characterized in that the fifth semiconductor layer is formed more deeply than the second semiconductor layer in the transistor of the sixth invention.

A device of an eighth invention is characterized in that it further comprises a second conductivity type sixth semiconductor layer selectively formed over a region held between the first main electrode and the first control electrode and a part of a region facing the first main electrode in the surface of the third semiconductor layer, and the third semiconductor layer is exposed on a region held between a surface of the sixth semiconductor layer and an exposed surface of the second semiconductor layer while being opposed to the first control electrode on this region in the transistor of any of the first to seventh inventions.

A device of a ninth invention is characterized in that the second semiconductor layer is selectively formed on a region enclosed with an external region along an outer periphery in the first major surface of the first semiconductor layer, and the transistor further comprises a second conductivity type seventh semiconductor layer selectively formed in the external region to enclose the second semiconductor layer and a third main electrode formed on a surface of the seventh semiconductor layer and electrically connected with the first main electrode in the transistor of any of the first to eighth inventions.

A device of a tenth invention is characterized in that the first and third main electrodes are formed on the first major surface while integrally coupling with each other in the transistor of the ninth invention.

A device of an eleventh invention is characterized in that the seventh semiconductor layer is formed more deeply than the second semiconductor layer in the transistor of the ninth or tenth invention.

A device of a twelfth invention is characterized in that the first semiconductor layer comprises an eighth semiconductor layer joined with the semiconductor layer and a ninth semiconductor layer exposed on the second major surface and the ninth semiconductor layer is higher than the eighth semiconductor layer in an impurity concentration in the transistor of any of the first to eleventh inventions.

A fabrication method of a thirteenth invention is a method of fabricating a transistor comprising the following steps (a) to (i): Namely, (a) a step of preparing a first conductivity type semiconductor substrate as a first semiconductor layer, and the semiconductor substrate defines a first major surface and a second major surface; (b) a step of introducing a second conductivity type impurity into the first major surface of the first semiconductor layer thereby forming a second conductivity type second semiconductor layer; (c) a step of selectively forming an insulating film on a surface of the second semiconductor layer; (d) a step of forming a first control electrode on the insulating film; (e) a step of selectively introducing a first conductivity type impurity into the surface of the semiconductor layer while employing the first control electrode as a part of a mask, thereby selectively forming a first conductivity type third semiconductor layer; (f) a step of selectively introducing a first conductivity type impurity into the surface of the second semiconductor layer while employing the first control electrode as a part of a mask, thereby selectively forming a first conductivity type fourth semiconductor layer in isolation from the third semiconductor layer; (g) a step of forming a second control electrode on a region different from a region in the exposed surface of the second semiconductor layer on which the insulating film is formed; (h) a step of forming a first main electrode on a surface of the third semiconductor layer; and (i) a step of forming a second main electrode on the second major surface of the first semiconductor layer.

A fabrication method of a fourteenth invention is a method of fabricating a transistor characterized in that the step (e) and the step (f) share the following single step (j) in the fabrication method of the thirteenth invention: Namely, (j) a step of selectively implanting a first conductivity type impurity into the surface of the second semiconductor layer while using a single screen covering the first major surface and selectively having an opening part corresponding to the third and fourth semiconductor layers as a mask and thereafter diffusing the same thereby simultaneously forming the third and fourth semiconductor layers.

In a fabrication method of a fifteenth invention, the step (e) comprises (e-1) a step of selectively implanting a first conductivity type impurity into the surface of the second semiconductor layer while using a screen covering the first major surface and selectively defining an opening part corresponding to the fourth semiconductor layer in cooperation with the first control electrode as a mask and thereafter diffusing the same, and the step (f) comprises (f-1) a step of selectively implanting a first conductivity type impurity into the surface of the second semiconductor layer while using a screen covering the first major surface and selectively defining an opening part corresponding to the third semiconductor layer in cooperation with the first control electrode as a mask after the step (e-1) in the fabrication method of the thirteenth invention.

The step (e) and the step (f) are further characterized in sharing the following single step (k): Namely, (k) a step of simultaneously diffusing the impurity diffused in the step (e-1) and the impurity implanted in the step (f-1) after the step (f-1) thereby forming the third and fourth semiconductor layers so that the fourth semiconductor layer is deeper than the third semiconductor layer.

A fabrication method of a sixteenth invention is characterized in further comprising (l) a step of selectively introducing a second conductivity type impurity into a region in the first major surface in which the third semiconductor layer is formed thereby forming a second conductivity type fifth semiconductor layer to be deeper than the third semiconductor layer, and higher in impurity concentration than the second semiconductor layer after the step (a) or the step (b) in the fabrication method of any of the thirteenth to fifteenth inventions.

A fabrication method of a seventeenth invention is characterized in further comprising (m) a step of selectively introducing a second conductivity type impurity into the surface of the third semiconductor layer not to reach the exposed surface of the second semiconductor layer opposed to the first control electrode while employing the first control electrode as a part of a mask thereby selectively forming a second conductivity type sixth semiconductor layer after the steps (e) and (f), and the step (h) comprises (h-1) a step of forming the first main electrode on both of the exposed surface of the third semiconductor layer and the surface of the sixth semiconductor layer in the fabrication method of any of the thirteenth to sixteenth inventions.

A fabrication method of an eighteenth invention is characterized in further comprising (n) a step of selectively introducing a second conductivity type impurity into an external region along an outer periphery in the first major surface thereby selectively forming a second conductivity type seventh semiconductor layer to enclose the second semiconductor layer after the step (a) or the step (b) and (o) a step of forming a third main electrode electrically connected with the first main electrode in the fabrication method of any of the thirteenth to seventeenth inventions.

In a fabrication method of a nineteenth invention, the step (n) comprises (n-1) a step of selectively implanting and diffusing a second conductivity type impurity into the external region along the outer periphery in the first major surface after the step (a) and in advance of the step (b), and the step (b) comprises (b-1) a step of implanting a second conductivity type impurity into the first major surface of the first semiconductor layer in the fabrication method of the eighteenth invention.

The step (n) and the step (b) are characterized in further sharing the following single step (p): Namely, (p) a step of simultaneously diffusing the impurity diffused in the step (n-1) and the impurity diffused in the step (b-1) thereby forming the second and seventh semiconductor layers so that the seventh semiconductor layer is deeper than the second semiconductor layer after the step (b-1).

A fabrication method of a twentieth invention is characterized in that the step (l) comprises (l-1) a step of selectively introducing a second conductivity type impurity while using a screen covering the first major surface and selectively defining an opening part in a region in which the third semiconductor layer is to be formed and the external region along an outer periphery thereby forming the fifth semiconductor layer and simultaneously selectively forming a second conductivity type seventh semiconductor layer to enclose the second semiconductor layer after the step (a) or the step (b) in the fabrication method of the sixteenth invention.

The invention first to twentieth inventions attain the following effects respectively:

First, in the transistor of the first invention, the exposed surface of the second semiconductor layer opposed to the first control electrode through the insulating film functions as a channel region. When bringing the transistor into an ON state, a prescribed voltage is applied between the first control electrode and the first main electrode, while a base current is supplied through the second control electrode similarly to a bipolar transistor. Then, an inverse channel is formed in the channel region, and the third and fourth semiconductor layers conduct with each other.

Therefore, these third and fourth semiconductor layers function as one emitter layer in the bipolar transistor by coupling with each other. Consequently, the transistor of this invention exhibits behavior similar to the bipolar transistor. Namely, an operation of the transistor of this invention in an ON state is similar to the bipolar transistor. Thus, a low ON-state voltage equivalent to the bipolar transistor is implemented.

When bringing the transistor of this invention into an OFF state, on the other hand, the voltage between the first control electrode and the first main electrode is zeroed or reverse-biased, while the supply of the base current through the second control electrode is stopped similarly to the bipolar transistor. Then, the channel region returns to the original conductivity type, whereby the coupling between the third and fourth semiconductor layers is canceled. Then, only the third semiconductor layer connected to the first main electrode maintains the function as an emitter region.

In the main current flowing between the first and second main electrodes in the ON state, therefore, only the first component not flowing through the fourth semiconductor layer exhibits behavior to a collector current of the bipolar transistor during a turn-off time. The second component flowing through the fourth semiconductor layer in the ON state rapidly attenuates similarly to a MOS. Namely, an ON-state voltage equivalent to the bipolar transistor is attained, and a turn-off characteristic superior to the bipolar transistor is attained in the transistor of the first invention.

In the transistor of the second invention, the first control electrode and the fourth semiconductor layer intervene between the first main electrode and the second control electrode, whereby the space between the first main electrode and the second control electrode can be widely ensured. Namely, in ensuring an isolation region necessary in case of forming the first main electrode and the second control electrode by the same material in the same step, it is not necessary to set a specific margin for the space between these electrodes, and the area efficiency of the device can be improved. Namely, refinement of the device can be implemented while ensuring simplification of the fabrication steps and moreover requiring no redundant design.

Further, the invention of the first control electrode and the fourth semiconductor layer between the first main electrode and the second control electrode to which the third semiconductor layer is connected contributes to suppress a component contributing to amplification of the first component lower than a component contributing to amplification of the second component of the main current in the base current supplied through the second control electrode. Namely, it contributes to increase the ratio of the second component to the first component. Consequently, the turn-off characteristic further improves.

In the transistor of the third invention, the third and fourth semiconductor layers are formed in the shape of stripes which are parallel to each other, whereby the exposed surface of the second semiconductor is also in the form of stripes parallel thereto. Namely, all exposed surfaces of the respective semiconductor layers in the first major surface are in the form of stripes parallel to each other. Therefore, arrangement of the first electrode and the first and second control electrodes on the first major surface becomes easy. In particular, it is easy to arrange the first main electrode and the second control electrode without intersecting with each other. Namely, there is such an effect that the fabrication steps are simplified. Further, the respective elements of the device are parallel to each other, whereby uniformity of the characteristics of the device is also implemented at a high level.

In the transistor of the fourth invention, the first component of the main current is suppressed more lowly than the second component, whereby the turn-off characteristic further improves.

In the transistor of the fifth invention, the fourth semiconductor layer is formed more deeply than the third semiconductor layer, whereby the ratio of the second component to the first component of the main current is increased. It is possible to suppress the first component to a degree negligible as compared with the second component by properly setting the depths of these semiconductors layers, and a turn-off time which is short equivalently with a MOS or an IGBT can be implemented by doing so.

In the transistor of the sixth invention, the fifth semiconductor layer is formed adjacently to the bottom portion of the second semiconductor layer, whereby the first component of the main current is lowly suppressed. It is possible to suppress the first component to a degree negligible as compared with the second components by properly setting the depth and the impurity concentration of the fifth semiconductor layer, and a turn-off time which is short equivalently with the MOS or the IGBT can be implemented by doing so.

In the transistor of the seventh invention, the fifth semiconductor layer is formed more deeply than the second semiconductor layer, whereby the first component of the main current is further effectively lowly suppressed.

In the transistor of the eighth invention, the part of the exposed surface of the third semiconductor layer in the region held between the surface of the sixth semiconductor layer and the exposed surface of the second semiconductor layer is opposed to the first control electrode, and functions as a channel region. Namely, it is possible to form an inverted channel in this channel region by applying reverse bias between the first control electrode and the first main electrode when bringing the device into an OFF state. The sixth semiconductor layer connected to the first main electrode and the second semiconductor layer conduct by doing so. Namely, the second semiconductor layer is short-circuited to the first main electrode. Therefore, the value of a withstand voltage of the device at the time of bringing the second control electrode into an open state just becomes a high value equivalent to a withstand voltage at the time of rendering the second control electrode and the first main electrode at the same potential. Namely, it is possible to increase the withstand voltage in the state opening the second control electrode.

In the transistor of the ninth invention, the seventh semiconductor layer is formed to enclose the second semiconductor layer and moreover maintained at the same potential as the first main electrode through the third main electrode, whereby if it is possible to suppress or prevent the withstand voltage of the device from deteriorating on an end portion of the second semiconductor layer.

In the transistor of the tenth invention, the first and third main electrodes are formed on the first major surface while coupling with each other, whereby it is necessary not set an isolation region for isolating the same between the first and third main electrodes. Therefore, the area efficiency of the device improves, and miniaturization of the device is facilitated.

In the transistor of the eleventh invention, the seventh semiconductor layer is formed more deeply than the second semiconductor layer, whereby the effect of suppressing deterioration of the withstand voltage is further improved.

In the transistor of the twelfth invention, the first semiconductor layer comprises the ninth semiconductor layer containing the impurity in high concentration and being exposed on the second major surface, whereby it is possible to increase the thickness of the device to a degree required in fabrication while eliminating influence on the characteristics of the device. Namely, the fabrication steps for the device are simplified.

In the fabrication method of the thirteenth invention, it is possible to readily obtain the transistor of the first invention by employing a general known wafer process in combination. Moreover, the third and fourth semiconductor layers for formed by performing introduction of the impurities while using the first control electrode as a part of the mask, whereby the positional relation between these semiconductor layers and the first control electrode is properly and readily settled. Namely, it compatibly implements high accuracy and readiness in fabrication.

In the fabrication method of the fourteenth invention, the third semiconductor layer and the fourth semiconductor layer are simultaneously formed by employing a single screen, whereby the fabrication steps are further simplified.

In the fabrication method of the fifteenth invention, implantation and diffusion of the impurity corresponding to the third semiconductor layer are executed after performing implantation and diffusion of the impurity corresponding to the fourth semiconductor layer. In the process of diffusion of the impurity corresponding to the third semiconductor layer, diffusion of the impurity corresponding to the third semiconductor layer, diffusion of the impurity corresponding to the fourth semiconductor layer is also simultaneously performed. Namely, diffusion of the impurity corresponding to the fourth semiconductor layer is performed twice, whereby the fourth semiconductor layer is formed more deeply as compared with the third semiconductor layer. Namely, the transistor of the fifth invention can be efficiently fabricated without requiring a specific step for deepening the fourth semiconductor layer.

In the fabrication method of the sixteenth invention, the transistor of the sixth invention can be obtained by a simple method since it comprises the step of forming the fifth semiconductor layer by selectively introducing the impurity.

In the fabrication method of the seventeenth invention, the sixth semiconductor layer is formed by selectively introducing the impurity and the first main electrode is formed on both of the third and sixth semiconductor layers, whereby the transistor of the eighth invention can be obtained by a simple method. Moreover, introduction of the impurity is performed while employing the first control electrode as part of the mask in formation of the sixth semiconductor layer, whereby the positional relation between the sixth semiconductor layer and the first control electrode is properly and readily settled. Namely, it compatibly implements high accuracy and readiness in fabrication.

In the fabrication method of the eighteenth invention, the transistor of the ninth invention can be obtained by a simple method since it comprises the step of forming the seventh semiconductor layer by selectively introducing the impurity and the step of forming the third main electrode.

In the fabrication method of the nineteenth invention, implantation and diffusion of the impurity corresponding to the second semiconductor layer are executed after performing implantation and diffusion of the impurity corresponding to the seventh semiconductor layer. In the process of diffusion of the impurity corresponding to the second semiconductor layer, diffusion of the impurity corresponding to the seventh semiconductor layer is also simultaneously performed. Namely, diffusion of the impurity corresponding to the seventh semiconductor layer is performed twice, whereby the seventh semiconductor layer is former more deeply as compared with the second semiconductor layer. Namely, the transistor of the eleventh invention can be efficiently fabricated without requiring a specific step for deepening the seventh semiconductor layer.

In the fabrication method of the twentieth invention, the fifth semiconductor layer and the seventh semiconductor layer are simultaneously formed by employing a single screen, whereby the fabrication steps are further simplified.

BRIEF DESCRIPTION OF THE DRAWINGS

FIG. 20 is a front sectional view of a cell region of a device of an embodiment 3.

DESCRIPTION OF THE PREFERRED EMBODIMENTS

1. Embodiment 1

First, description is made as to a transistor of an embodiment 1.

1-1. Overall Structure of Device

Figure 2:
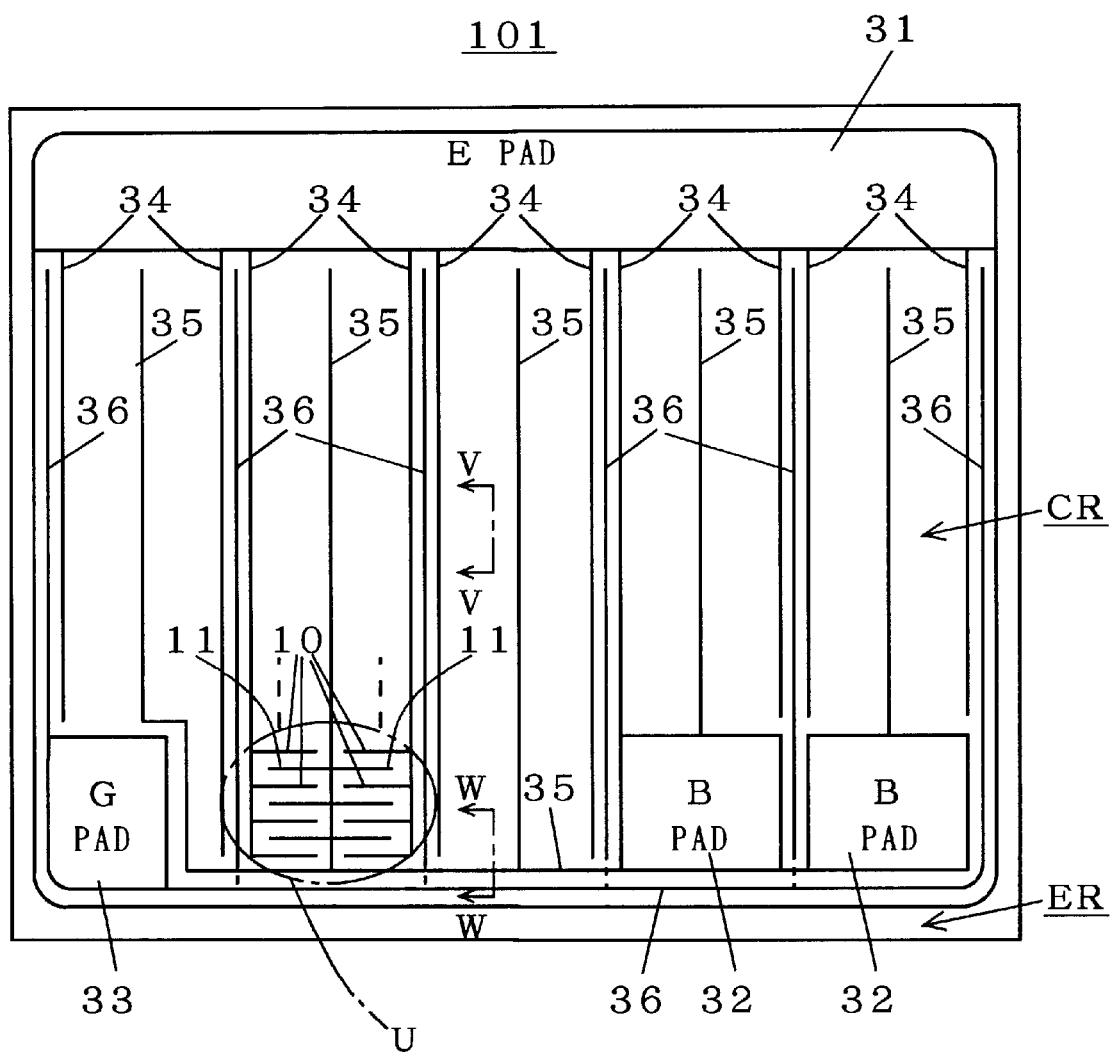
FIG. 2 is a plan view of the device of the embodiment 1.

FIG. 2 is a plan view of the transistor of this embodiment. The transistor 101 has a single flat plate-shaped semiconductor base body. Unit cells which are the minimum units functioning as the transistor are built into the semiconductor base body in numbers. A region in which these unit cells are arranged is called a cell region CR. The cell region CR occupies a central part enclosed with an external region ER formed along the periphery of the semiconductive base body.

On an upper major surface (the surface appearing in FIG. 2) of the semiconductor base body, an emitter pad 31, base pads 32 and a gate pad 33 are arranged on portions corresponding to the boundaries between the cell region CR and the external region ER. The emitter pad 31 and the base pads 32 as well as the gate pad 33 are arranged on positions opposed to each other.

From the emitter pad 31, a plurality of emitter wires 34 are arranged to project along the upper major surface in the form of the teeth of a comb toward the opposite side where the base pads 32 and the gate pad 33 are arranged. On the other hand, base wires 35 project from the base pads 32 toward the side of the emitter pad 31 in the form of the teeth of a comb. Similarly, gate wires 36 project from the gate pad 33 toward the emitter pad 31 in the form of the teeth of a comb.

Further, as drawn in a circle provided with symbol U as a representative, emitter electrodes (first main electrodes) 10 are connected to the emitter wires 34, and base electrodes 11 are connected to the base wires 35. The emitter electrodes 10 and the base electrodes 11 of this are arranged to project from single ones to the other ones of the base wires 35 and the gate wires 36 arranged in parallel with each other in directions opposed to each other in the form of the teeth of combs. Moreover, the emitter electrodes 10 and base electrodes 11 are arranged in parallel with each other. In the cell region CR, the emitter electrodes 10 and the base electrodes 11 are thus alternately arranged.

All of the emitter pad 31, the emitter wires 34 and the emitter electrodes 10 connected with each other and the base pads 32, the base wires 35 and the base electrodes 11 connected with each other are made of the same material, and moreover these are entirely formed in the same step. The emitter wires 34 and the base wires 35 mutually project toward the counter sides in the form of the teeth of combs and the emitter electrodes 10 and the base electrodes 11 similarly mutually project toward the counter sides in the form of the teeth of combs, thereby avoiding intersection of these wires and electrodes.

Due to that, it is possible to form the emitter pad 31, the emitter wires 34, the emitter electrodes 10, the base pads 32, the base wires 35 and the base electrodes 11 in the same step. This brings simplification of fabrication steps of the transistor 101. Although not appearing in FIG. 2, gate electrodes connected to the gate wires 36 are arranged in parallel with the emitter electrodes 10 and the base electrodes 11 in the cell region CR. <1-2. Sectional Structure and Operation of Cell Region>

Figure 1:
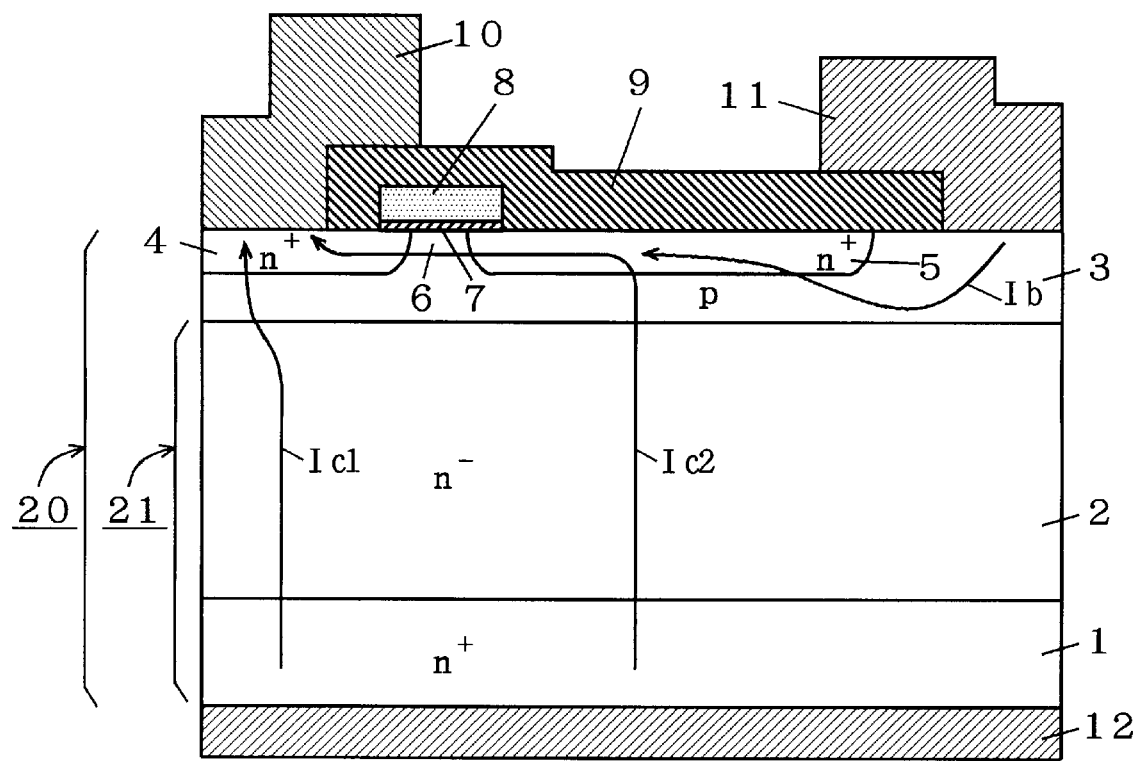
FIG. 1 is a front sectional view of a cell region of a device of an embodiment 1.

FIG. 1 is a sectional view showing a section of the device 101 along a V—V cutting-plane line (FIG. 2) in the cell region CR. As shown in FIG. 1, an $n^-$ layer 2 containing an n-type impurity in low concentration is formed on an $N^+$ layer 1 containing an n-type impurity in high concentration in the device 101, and a base layer (second semiconductor layer) 3 containing a p-type impurity is formed on the $n^-$ blayer 2. A collector layer (first semiconductor layer) 21 is formed by the $N^+$ layer 1 and the $n^-$ layer 2, each of which is of the n type.

On an upper major surface of the base layer 3, a first emitter layer (third semiconductor layer) 4 and a second emitter layer (fourth semiconductor layer) 5 are formed with a clearance therebetween by selectively introducing an n-type impurity of high concentration. Each of these first and second emitter layers 4 and 5 contains an n-type impurity in high concentration. A flat plate-shaped semiconductor base body 20 having upper and lower two major surfaces is formed by the aforementioned five semiconductor layers 1, 2, 3, 4 and 5. The N$^+$ layer 1 forming the collector layer 21 is provided for the purpose of simplifying an operation of thickening the semiconductor base body 20 at a degree required in a step of performing slicing from a semiconductor ingot to a wafer without changing the characteristics of the device 101.

A gate insulating film (insulating film) 7 is formed on a channel region 6 defined in a region, held between the first emitter layer 4 and the second emitter layer 5, where the base layer 3 is exposed in the upper major surface of the semiconductor base body 20. A conductive gate electrode 8 is formed on this gate insulating film 7. Namely, the gate electrode (first control electrode) 8 is opposed to the channel region 6 through the gate insulating film 7.

The emitter electrode 10 is connected to the part of the first emitter layer 4 in the upper major surface of the semiconductor base body 20, and the base electrode (second control electrode) 11 is connected to the exposed surface of the base layer 3 different from the channel region 6. The three types of electrodes 8, 10 and 11 formed on the upper major surface of the semiconductor base body 20 are isolated from each other by an interlayer isolation film 9 similarly formed on the upper major surface of the semiconductor base body 20.

On the other hand, a collector electrode (second main electrode) 12 is formed on the lower major surface of the semiconductor base body 20, i.e., on the surface of the collector layer 21 (or, the N+ layer 1). The collector electrode 12 forms a pair of main electrodes functioning as paths of a collector current (main current) with the emitter electrode 10. Each of the two types of gate electrode 8 and base electrode 11 functions as a control electrode controlling the collector current.

In such a representative example that the material forming the semiconductor base body 20 is mainly composed of silicon, the gate insulating film 7 is preferably made of a thermal oxide film of silicon, i.e., SiO$_2$. Further, it is preferable that the gate electrode 8 is made of polysilicon doped with an impurity. In addition, the interlayer isolation film 9 is preferably made of BPSG, i.e., silicate glass containing boron and phosphorus.

Further, it is preferable that all of the emitter electrode 10 and the base electrode 11 as well as the emitter wire 34, the emitter pad 31, the base wire 35 and the base pad 32 connected therewith are made of aluminum, or Al—Si, i.e., aluminum containing Si, and the collector electrode 12 is preferably made of a TiNiAu alloy.

In addition, the gate pad 33 is also made of the same material as the emitter pad 31 etc. The gate wire 36 is made of the same material as the emitter pad 31 etc. and of the same material as the gate electrode 8, and a part (part drawn by dotted lines in FIG. 2) intersecting with the base wire 35 is made of only polysilicon.

In order to use this device 101, a collector voltage V$_{CE}$ of prescribed magnitude is applied between the collector electrode 12 and the emitter electrode 10 so that collector electrode 12 is positive by connecting an external power source. When applying a gate voltage V$_{GE}$ exceeding a gate threshold voltage V$_{GE}$(th) (turning a gate) between the gate electrode 8 and the emitter electrode 10 so that the gate electrode 8 is positive in this state, an n-type channel is formed in the channel region 6 due to inversion of the p-type channel region 6 to an n type. Consequently, the first emitter layer 4 and the second emitter layer 5 conduct with each other.

Figure 3:
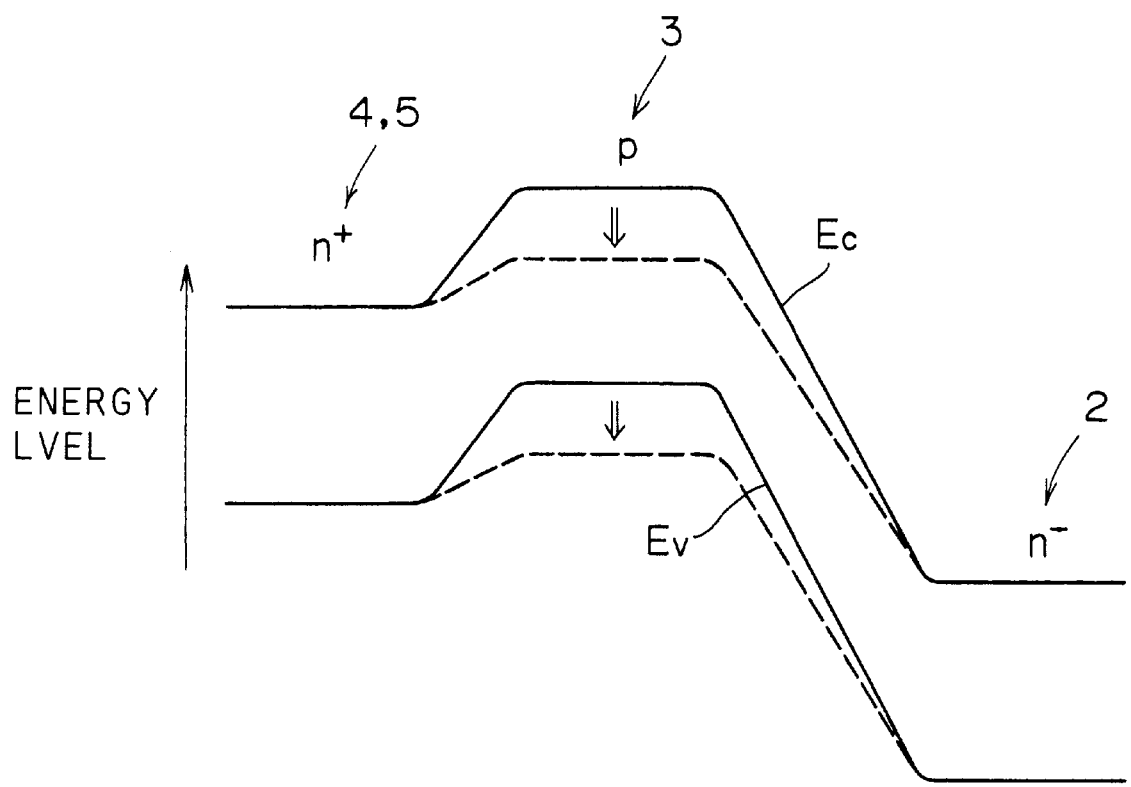
FIG. 3 is a band diagram of the device of the embodiment 1.

FIG. 3 is a band diagram of the transistor 101 in this state. As shown in FIG. 3, the first emitter layer 4 and the second emitter layer 5 function just as one emitter layer by coupling with each other through the channel region 6. Barriers by the diffusion potential of the base layer 3 are formed on the conduction band infimum E$_C$ and the valence band supremum E$_V$, whereby flow of electrons and holes across the emitter layer 4 and 5 and the n$^-$ layer 2, i.e., flow of the collector current from the collector electrode 12 to the emitter electrode 10 is inhibited. Namely, the transistor 101 is in an OFF state.

When a base current of prescribed magnitude is supplied from the base electrode 11 at this time, the conduction band infimum E$_C$ and the valence band supremum E$_V$ of the base layer 3 lower as shown by dotted lines. Namely, the diffusion potential in the base layer 3 is relaxed or canceled. Consequently, flow of electrons and holes takes place across the emitter layers 4 and 5 and the n$^-$ layer 2, and the collector current flows from the collector current 12 to the emitter electrode 10. Namely, the transistor 101 enters and ON state.

Figure 40:
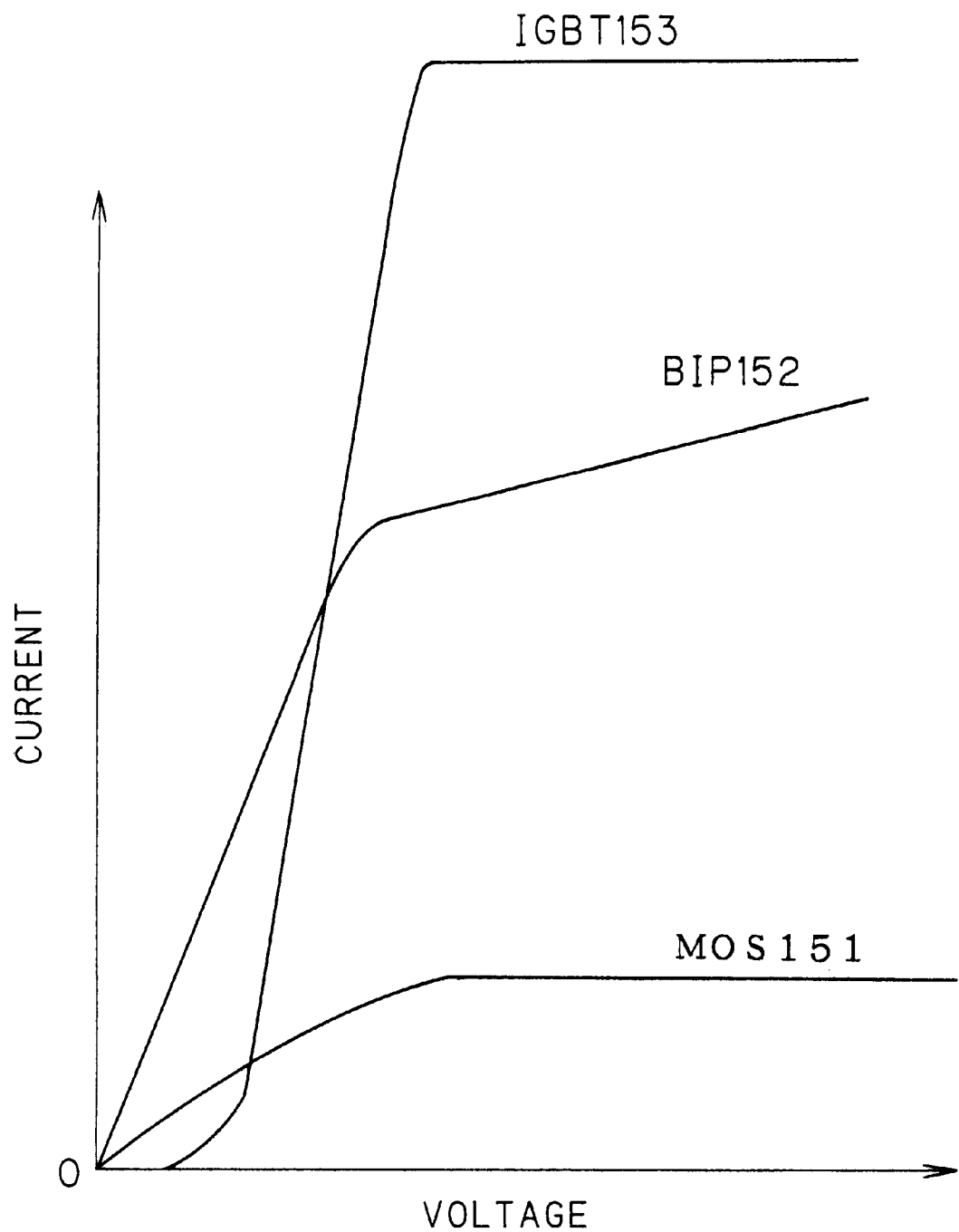
FIG. 40 is a graph showing output characteristics of the conventional three types of transistors.

Therefore, an operation in the ON state is equivalent to a bipolar transistor. Therefore, an output characteristic of the transistor 101 becomes equivalent to the output characteristic of the BIP 152 shown in FIG. 40. Namely, an ON-state voltage which is low similarly to the bipolar transistor is implemented in the transistor 101.

Returning to FIG. 1, the collector current at the time when the transistor 101 conducts by being supplied with the base current I$_b$ includes a first collector current I$_{C1}$ which is a component passing through only the first emitter layer 4 and a second collector current I$_{C2}$ which is a component passing through both of the second emitter layer 5 and the first emitter layer 4. In other words, the unit cell of the transistor 101 can be separated into a first transistor regarding the first emitter layer 4 as an emitter layer and a second transistor regarding the second emitter layer 5 as an emitter layer in correspondence to the regions where the two components I$_{C1}$ and I$_{C2}$ of the collector current pass through.

The two components I$_{C1}$ and I$_{C2}$ correspond to collect currents of these first and second transistors respectively. As described later, it is preferable that the first collector current I$_{C1}$ is as small as possible as compared with the second collector current I$_{C2}$.

An operation at the time when the transistor 101 transits from an ON state to an OFF state will be described next. In order to bring the transistor 101 being in an ON state into an OFF state, supply of the base current I$_b$ from the base electrode 11 is stopped, while the gate voltage V$_{GE}$ is returned to the value of zero, or a negative value (reverse bias) (turning off the gate).

Due to the fact that the gate voltage V$_{GE}$ is zeroed or reverse-biased, the channel having been formed in the channel region 6 disappears and the channel region 6 returns to the original p-type conductivity type. Consequently, the first emitter layer 4 and the second emitter layer 5 enter non-conducting states. Namely, only the first emitter layer 4 is connected to the emitter electrode 10 and maintains the function as the emitter layer in the first emitter layer 4 and the second emitter layer 5.

Figure 41:
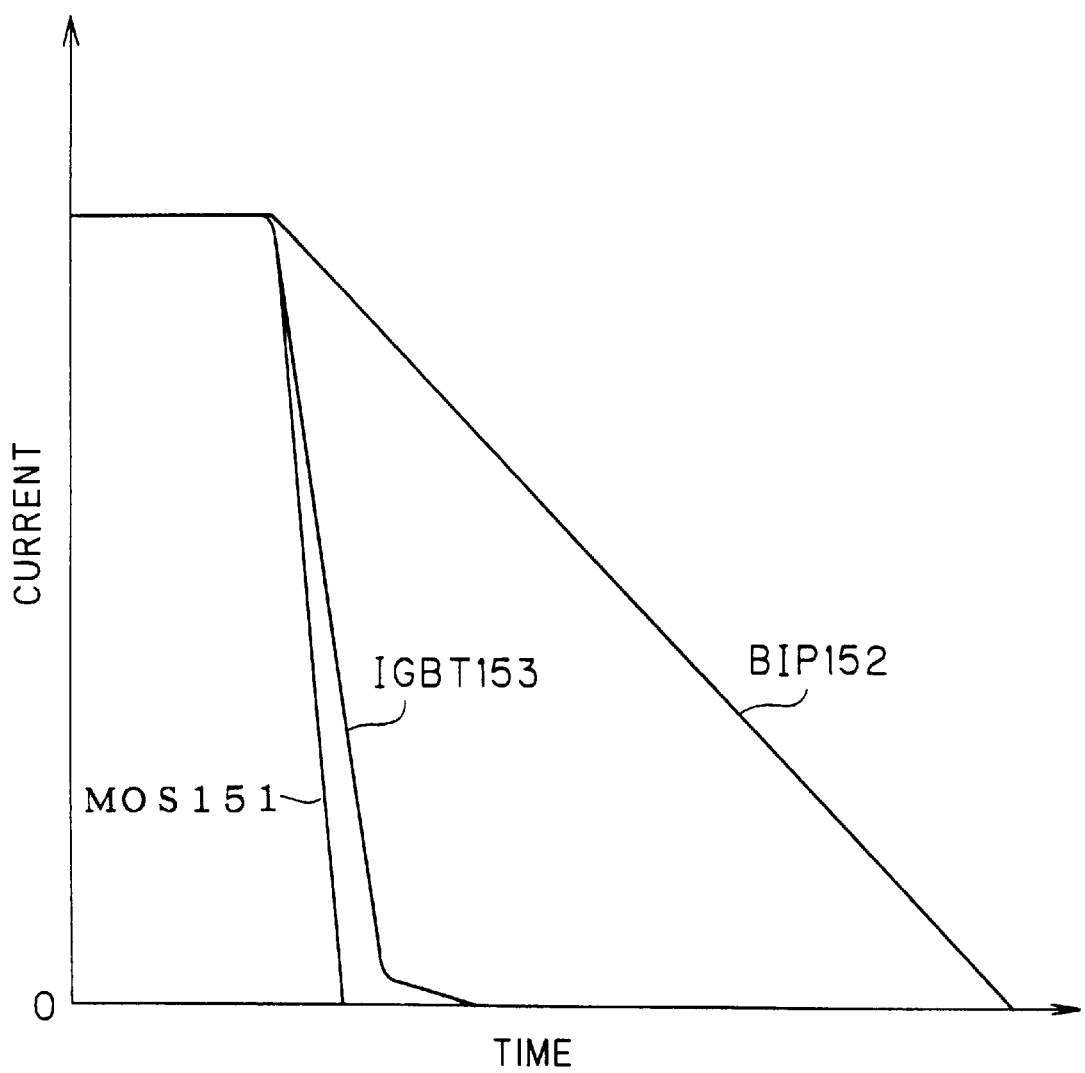
FIG. 41 is a graph showing turn-off characteristics of the conventional three types of transistors.

Therefore, one first collector current $I_{C1}$ exhibits behavior similar to a collector current of the bipolar transistor, while the other second collector current $I_{C2}$ exhibits behavior similar to a MOS or an IGBT. Namely, the first collector current $I_{C1}$ loosely attenuates at a speed equivalent to the BIP 152 shown in FIG. 41, while the second collector current $I_{C2}$ rapidly attenuates at a speed equivalent to the MOS 151 or the IGBT 153.

Thus, the collector current of the transistor 101 quickly attenuates as compared with the bipolar transistor. Particularly when the transistor 101 is so set that the second collector current $I_{C2}$ occupies a principal part of the collector current of the transistor 101 (i.e., $I_{C1} \ll I_{C2}$), the turn-off time of the transistor 101 shortens equivalently to the turn-off time of the MOS 151 or the IGBT 153. Even if thus set, the ON-state voltage remains at a low value equivalently to the bipolar transistor.

As hereinabove described, the transistor 101 compatibly implements an ON-state voltage which is low equivalently to the bipolar transistor and a turn-off characteristic which is superior as compared with the bipolar transistor. Moreover, the turn-off time approaches a short value equivalent to the MOS 151 or the IGBT 153 as the first collector current $I_{C1}$ is smaller as compared with the second collector current $I_{C2}$.

1-3. Arrangement of First and Second Emitter Layers

Figure 4:
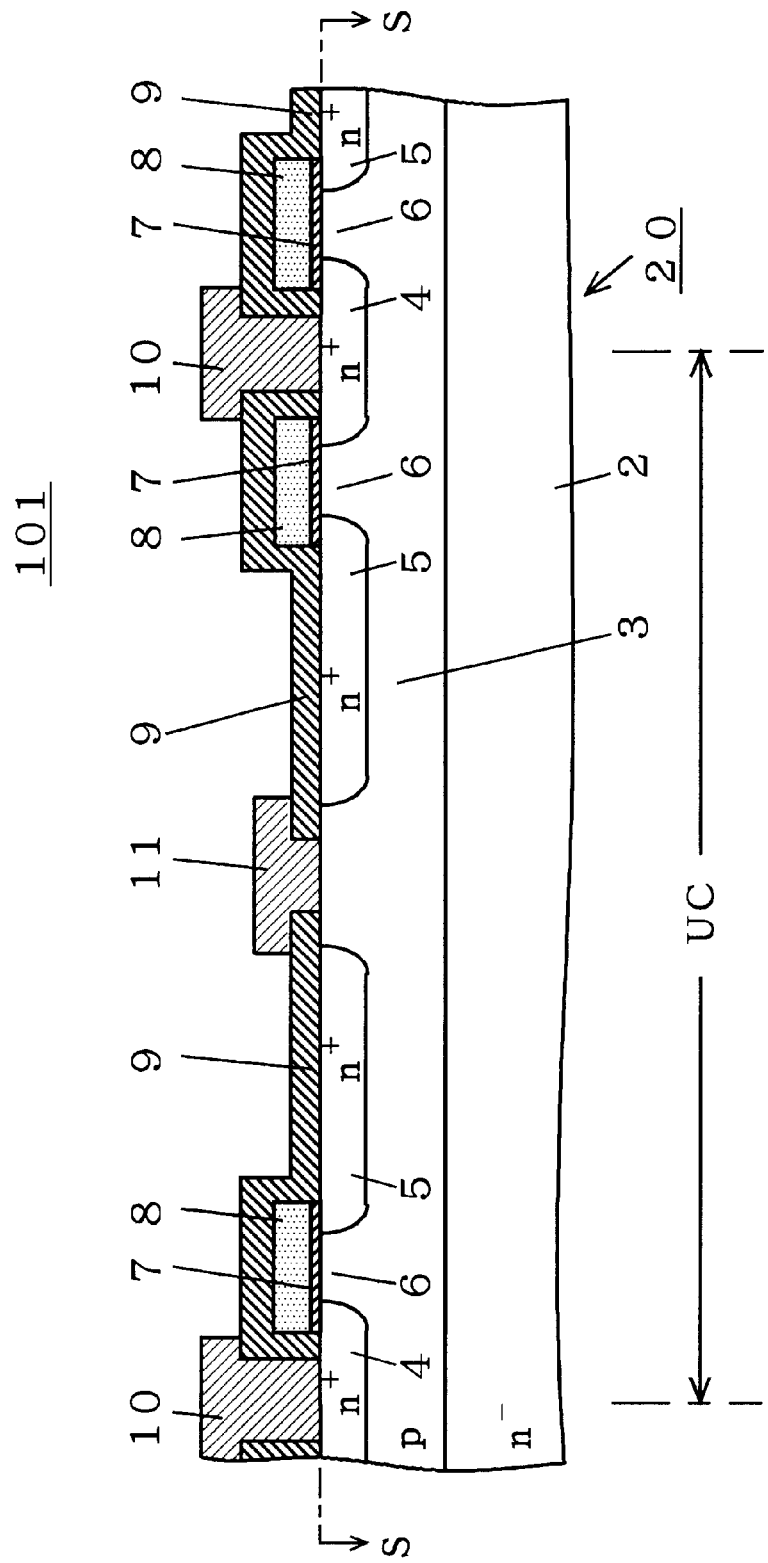
FIG. 4 is a front sectional view of the cell region of the device of the embodiment 1.

FIG. 4 is a sectional view of the transistor 101 along a V—V cutting-plane line similar to FIG. 1, and clearly shows the arrangement of the first emitter layers 4 and the second emitter layers 5 in the overall unit cell, in particular. In the transistor 101, a single first emitter layer 4 and two second emitter layers 5 are included in one unit cell UC. These first and second emitter layers 4 and 5 are so arranged that the two second emitter layers 5 hold both sides of the single first emitter layer 4 through the exposed surface of the base layer 3.

In the exposed surface of the base layer 3, the parts adjacent to both sides of the first emitter layer 4, i.e., the parts held by the first emitter layer 4 and the second emitter layers 5 function as the channel regions 6, and the base electrode 11 is connected to the part held between the two second emitter layers 5. Therefore, the second emitter layer 5 and the channel region 6 are present between the emitter electrode 10 to which the first emitter layer 4 is connected and the base electrode 11.

Therefore, the space between the emitter electrode 10 and the base electrode 11 can be widely ensured. Namely, it is not necessary to set a specific margin for the space between the emitter electrode 10 and the base electrode 11 in assurance of an isolation region necessary at the time of forming the emitter electrode 10 and the base electrode 11 by the same material in the same step, and the area efficiency of the major surface of the semiconductor base body 20 can be improved. Namely, there is such an advantage that refinement of the unit cell UC can be implemented while ensuring simplification of fabrication steps moreover without requiring redundant design.

Figure 5:
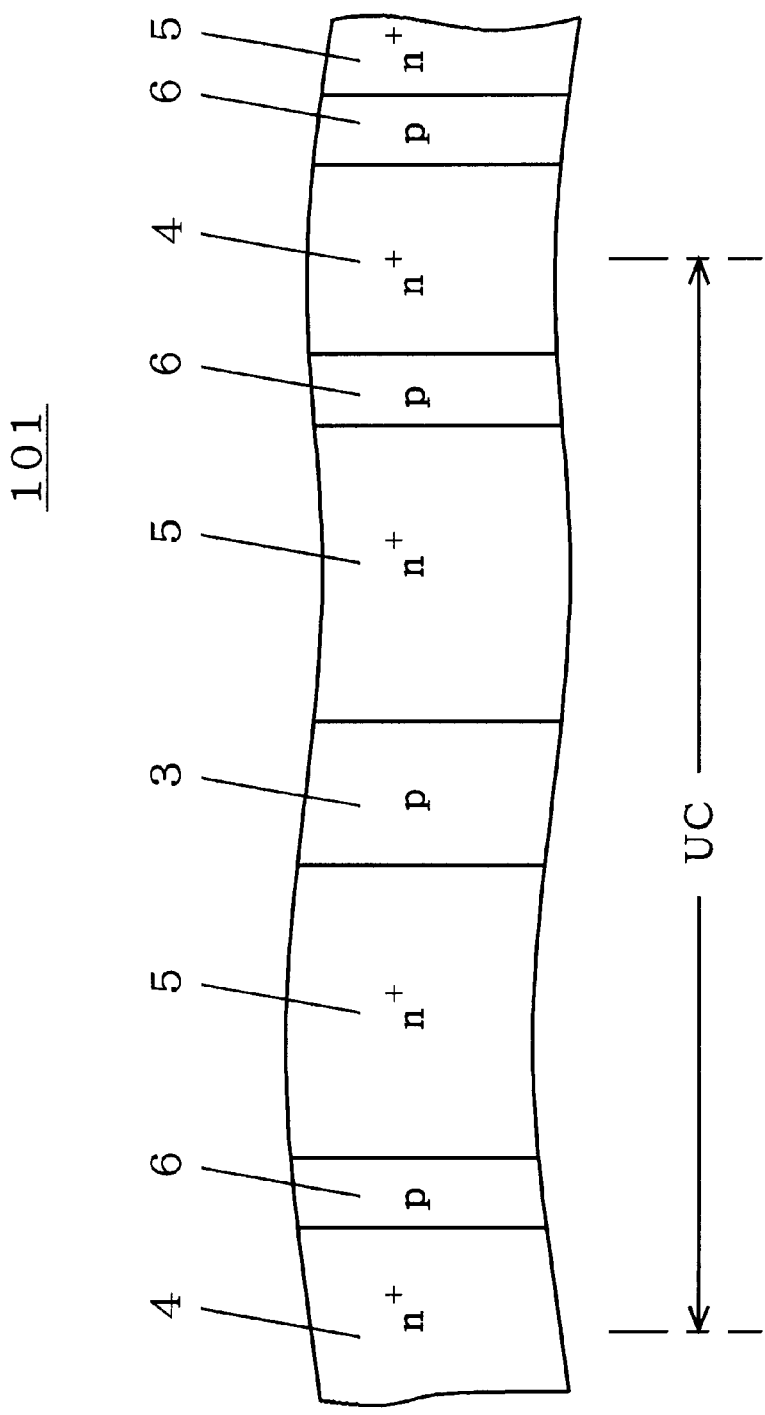
FIG. 5 is a sectional view of the device of the embodiment 1 along an S—S cutting-plane line.

FIG. 5 is a sectional view along an S—S cutting-plane line in FIG. 4, i.e., a plan view of the upper major surface of the semiconductor base body. As shown in FIG. 5, all of the first emitter layers 4 and the second emitter layers 5 are formed in the shape of stripes, moreover to be parallel with each other. Therefore, all of the base layer 3, the first emitter layers 4 and the second emitter layers 5 are exposed on the upper major surface of the semiconductor base body 20 in the form of stripes which are parallel to each other.

Thus, the exposed surfaces of the respective semiconductor layers are in the form of strips which are parallel to each other, whereby arrangement of the emitter electrodes 10, the base electrodes 11 and the gate electrodes 8 becomes easy. Further, uniformity of the characteristics of the unit cell is easy to obtain. Moreover, this structure is suitable for arranging the emitter electrodes 10 and the base electrodes 11 in the form of the teeth of combs engaging with each other not to intersect with each other, as shown in FIG. 2.

Further, the second emitter layers 5 and the channel regions 6 exist between the emitter electrodes 10 to which the first emitter layers 4 are connected and the base electrodes 11, whereby a component contributing to amplification of the first collector current $I_{C1}$ reduces as compared with a component contributing to amplification of the second collector current $I_{C2}$ in the base current $I_b$. Thus, such advantages that the first collector current $I_{C1}$ is suppressed lower than the second collector current $I_{C2}$ and the turn-off characteristic improves are also attained.

Thus, not only advantages in fabrication but also advantages in characteristics are attained by arranging the first and second emitter layers 4 and 5 as shown in FIG. 4 or FIG. 5.

1-4. Boundary between Cell Region CR and External Region ER

Figure 6:
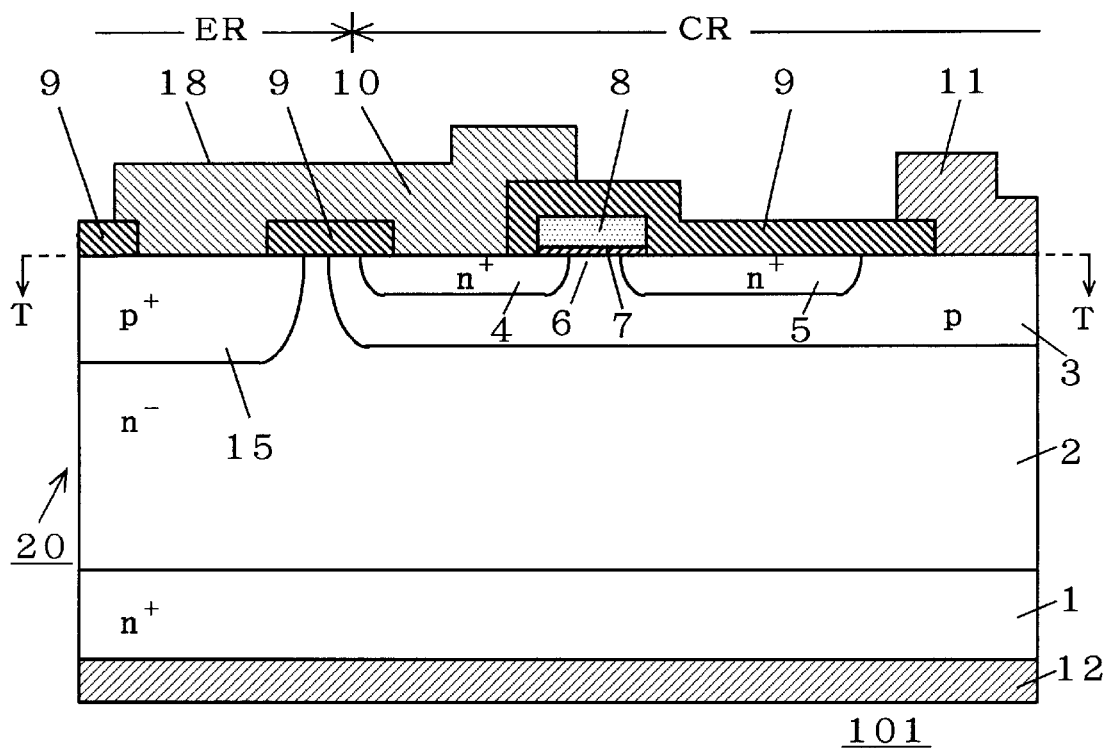
FIG. 6 is a front sectional view in the vicinity of an end portion of the cell region of the device of the embodiment 1.
Figure 7:
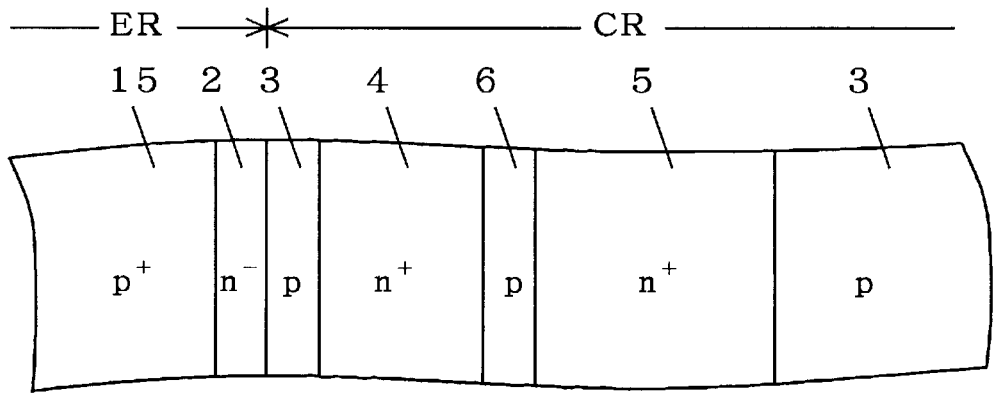
FIG. 7 is a sectional view of the device of the embodiment 1 along a T—T cutting-plane line.

FIG. 6 is a sectional view along a W—W cutting-plane line in FIG. 2, and shows the structure in the vicinity of the boundary between the cell region CR and the external region ER of the transistor 101. FIG. 7 is a sectional view along a T—T cutting-plane line in FIG. 6.

In the external region ER, a p region (seventh semiconductor layer) 15 which is a p-type semiconductor layer similar to the base layer 3 is formed on an upper surface portion of the n⁻ layer 2. This p region 15 is provided for the purpose of preventing the boundary portion between the cell region CR and the external region ER from deteriorating the withstand voltage of the overall transistor 101. In order to improve the effect of presenting withstand voltage deterioration, the p region 15 is preferably formed more deeply than the base layer 3, and more preferably, the impurity concentration of the p region 15 is set higher than the base layer 3.

In general, the p region 15 must be maintained at the same potential as the emitter electrode 10. Therefore, an electrode 18 maintained at the same potential as the emitter electrode 10 is connected to a surface of the p region 15. In the transistor 101, the first emitter layer 4 is formed on the position closest to the external region ER in the first emitter layer 4 and the second emitter layer 5, and the emitter electrode 10 is arranged on the position closest to the external region ER in the emitter electrode 10 and the base electrode 11 following this.

Therefore, the emitter electrode 10 connected to the first emitter layer 4 can be made an electrode 18 connected to the p region 15 by extending the same toward the upper surface of the p region 15. Namely, it is not necessary to set an isolation region between the emitter electrode 10 and the electrode 18 in the transistor 101.

Therefore, no redundant design in the vicinity of the boundary between the cell region CR and the external region ER is necessary. The area efficiency of the major surface of the semiconductor base body 20 in this part improves, and miniaturization of the device is facilitated.

1-5. Fabrication Method

Figure 8:
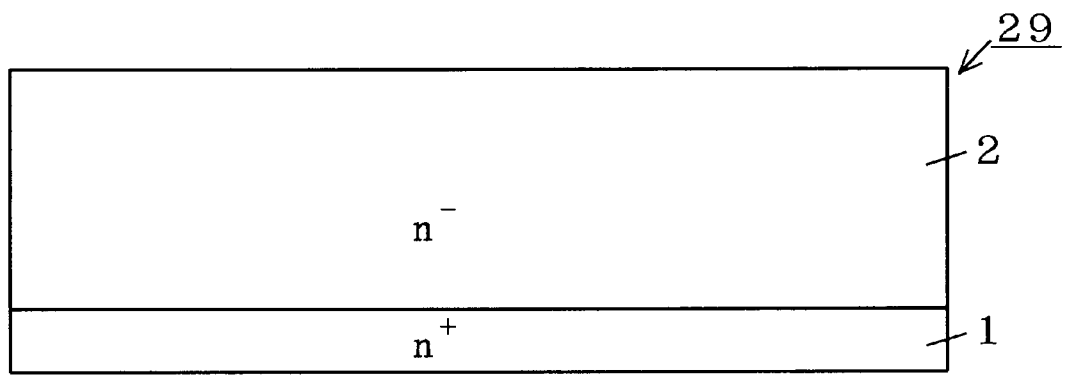
FIG. 8 is a fabrication step diagram of the device of the embodiment 1.

A fabrication method of the transistor 101 is now described. FIG. 8 to FIG. 15 are fabrication step diagrams showing a preferable example of the fabrication method of the transistor 101. In order to fabricate the transistor 101, a flat plate-shaped semiconductor substrate 29 forming the basis of the semiconductor base body 20 is formed first, as shown in FIG. 8. The semiconductor substrate 29 includes the n⁻ layer 2, and is formed by first preparing an n-type silicon substrate corresponding to the N⁺ layer 1 and thereafter depositing the n⁻ layer 2 on its one major surface by an epitaxy method, for example. In the following step diagrams, illustration of the N⁺ layer 1 is omitted for simplicity.

Figure 9:
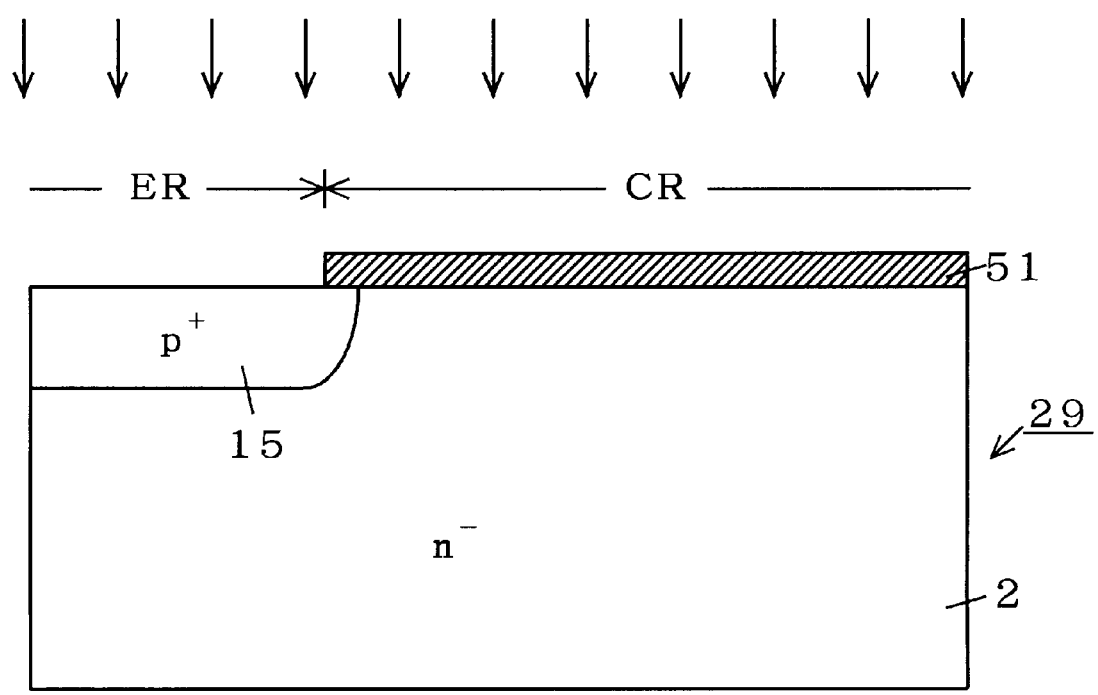
FIG. 9 is a fabrication step diagram of the device of the embodiment 1.

Then, a screen 51 selectively opening in the external region ER is formed on the upper major surface of the semiconductor substrate 29, i.e., on the surface of the n⁻ layer 2, as shown in FIG. 9. The pattern shape of the screen 53 is readily obtained by a known replicating technique employing lithography. A p-type impurity is selectively implanted by employing the screen 51 as a mask. Then, the screen 51 is removed, and thereafter the p-type impurity is diffused by performing annealing. Consequently, the p region 15 is selectively formed on a surface part of the n⁻ layer 2 corresponding to the external region ER.

Figure 10:
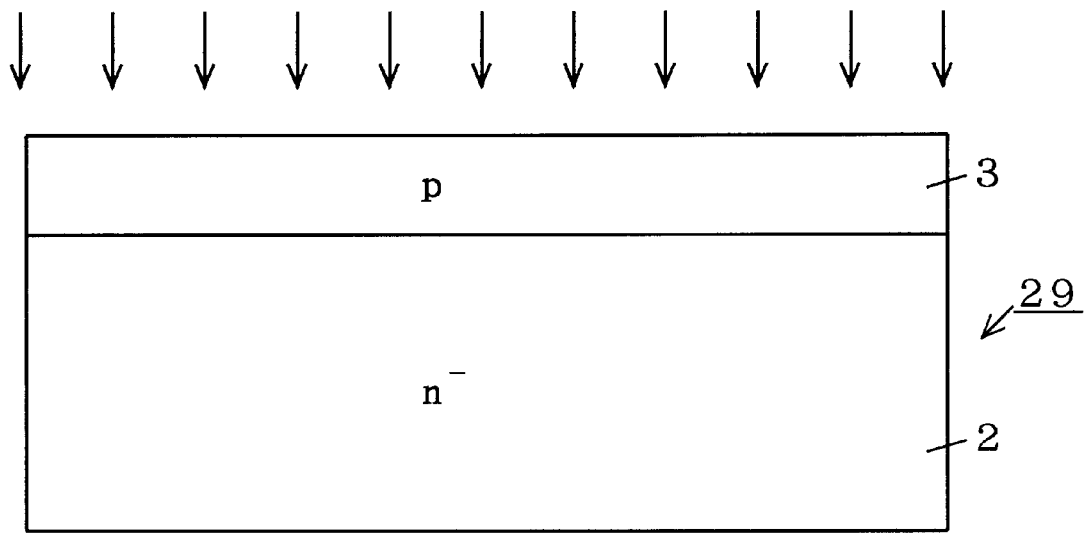
FIG. 10 is a fabrication step diagram of the device of the embodiment 1.

Then, a p-type impurity is implanted from the upper major surface of the semiconductor base body 29 and further diffused, thereby forming the base layer 3, as shown in FIG. 10. Consequently, the base layer 3 and the p region 15 are formed while coupling with each other. The depths and the impurity concentrations of the p region 15 and the base layer 3 are so set that the p region 15 is deeper and its impurity concentration is also higher.

Figure 11:
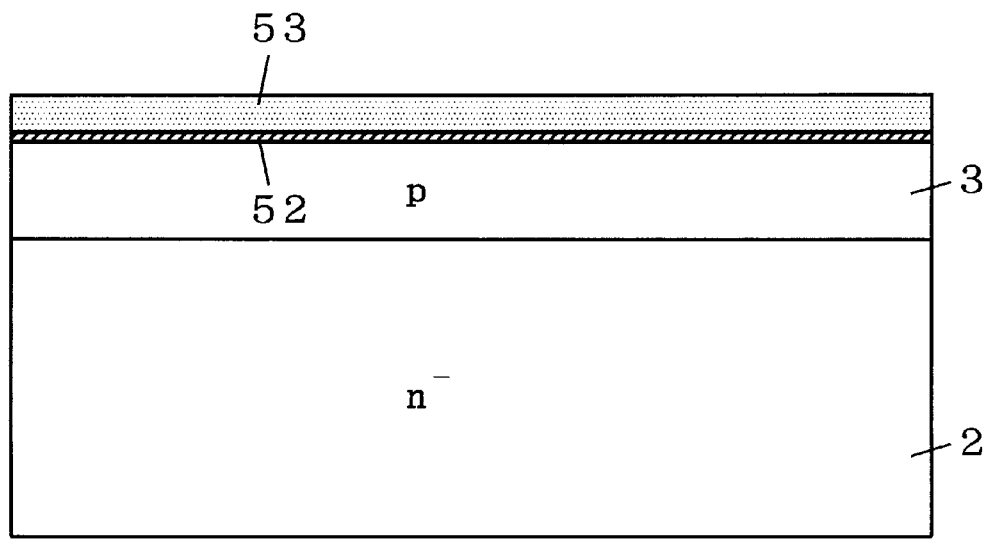
FIG. 11 is a fabrication step diagram of the device of the embodiment 1.
Figure 12:
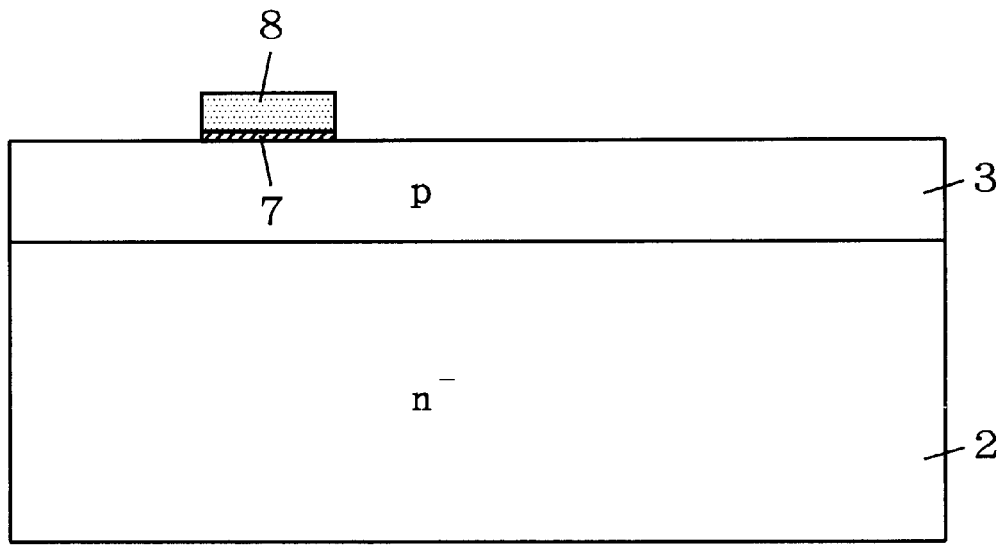
FIG. 12 is a fabrication step diagram of the device of the embodiment 1.

Then, a thermal oxide film 52 is formed on the upper surface of the base layer 3, and thereafter a polysilicon layer 53 is deposited on the thermal oxide film 52, as shown in FIG. 11. Subsequently, a screen having an opening part corresponding to the gate electrode 8 (FIG. 1 and FIG. 4) is formed on the polysilicon layer 53, and this screen is employed as a mask, thereby selectively etching the polysilicon layer 53 and the screen 52. Consequently, the gate electrode 8 is formed from the polysilicon layer 53, and the gate insulating film 7 is formed from the thermal oxide film 52, as shown in FIG. 12.

Figure 13:
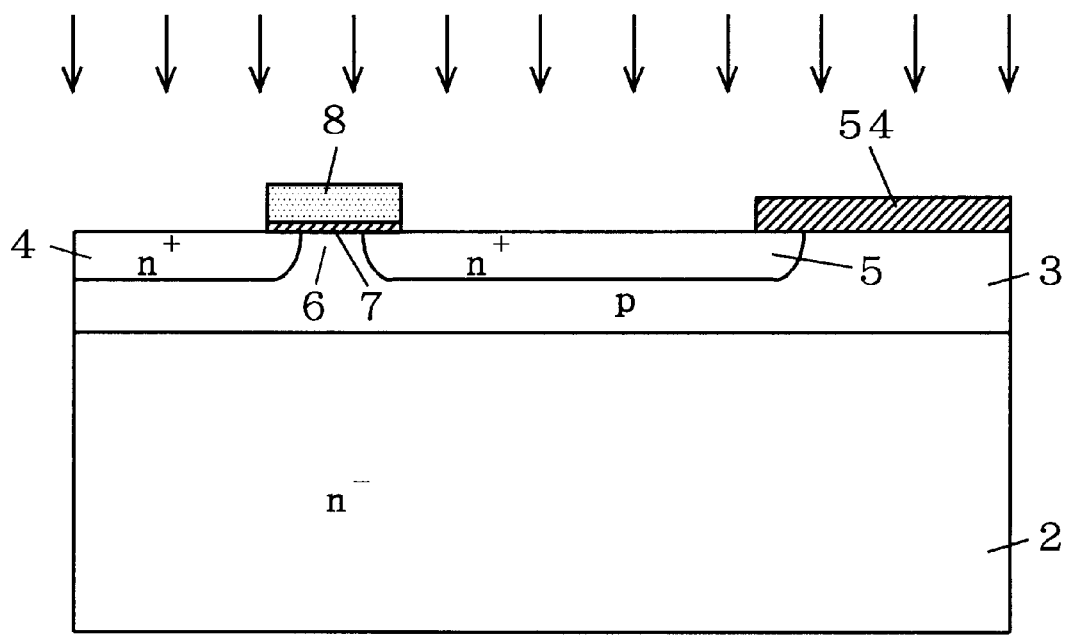
FIG. 13 is a fabrication step diagram of the device of the embodiment 1.

Then, a screen 54 is formed on the upper major surface of the semiconductor base body, as shown in FIG. 13. The screen 54 is so patterned as to define an opening part corresponding to the first emitter layer 4 and the second emitter layer 5 (FIG. 1 and FIG. 4) in cooperation with the gate electrode 8. These gate electrode 8 (and the gate insulating film 7) and screen 54 are employed as masks, thereby selectively implanting an n-type impurity into the upper surface part of the base layer 3. Subsequently, the screen 54 is removed and thereafter the n-type impurity is diffused, thereby selectively forming the first emitter layer 4 and the second emitter layer 5 on the upper surface part of the base layer 3.

Figure 14:
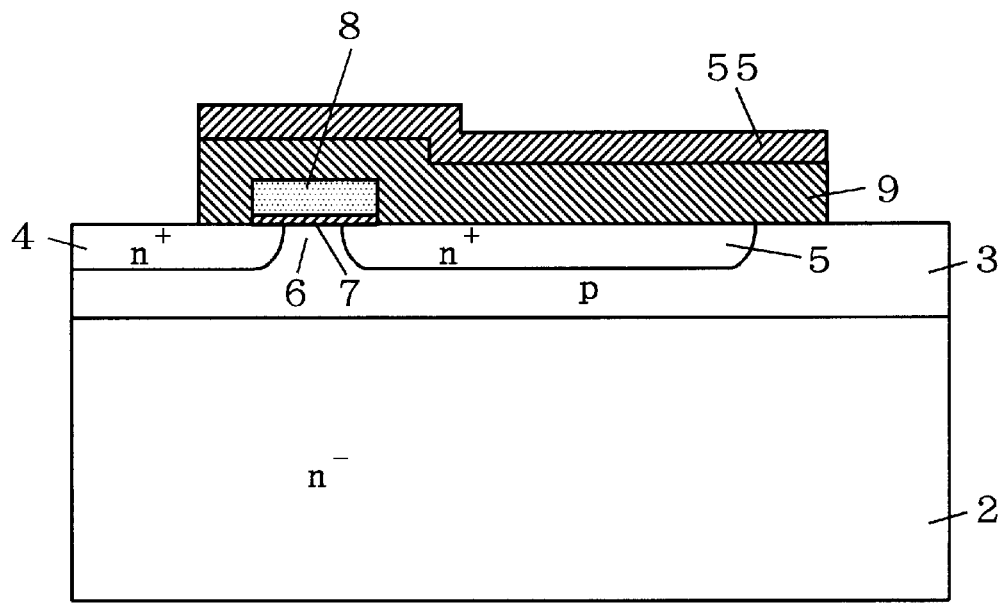
FIG. 14 is a fabrication step diagram of the device of the embodiment 1.

Then, an insulating film forming the basis of the interlayer isolation film 9 is deposited over the upper surfaces of the semiconductor base body and the gate electrode 8 and a screen 55 having a prescribed pattern is employed as a mask, thereby selectively etching the deposited insulating film, as shown in FIG. 14. Consequently, the interlayer isolation film 9 is formed. The interlayer isolation film 9 is formed to cover at least the gate electrode 8.

Figure 15:
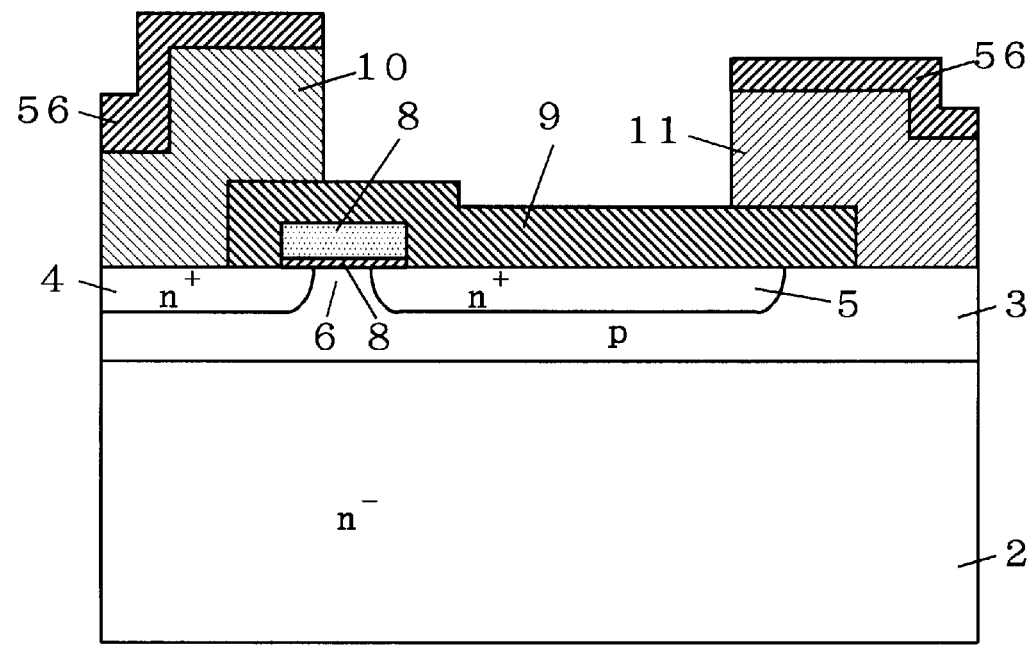
FIG. 15 is a fabrication step diagram of the device of the embodiment 1.

Then, the screen 55 is removed, and thereafter a conductor such as aluminum, for example, is deposited on the overall upper surface and a screen 56 having a prescribed pattern is employed as a mask, thereby selectively etching the deposited conductor, as shown in FIG. 15. Consequently, the emitter electrode 10 (including the electrode 18) and the base electrode 11 are formed. Thereafter the screen 56 is removed.

Then, a TiNiAu alloy, for example, is deposited on the lower major surface of the semiconductor base body 20, i.e., on the surface of the N⁺ layer 1, thereby forming the collector electrode 12, as shown in FIG. 1. The transistor 101 is completed by the aforementioned steps.

As hereinabove illustrated, the device 101 can be readily fabricated by employing the deposition step and the ordinary wafer process mainly composed of the implantation and diffusion steps of the impurities in combination.

2. Embodiment 2

Figure 16:
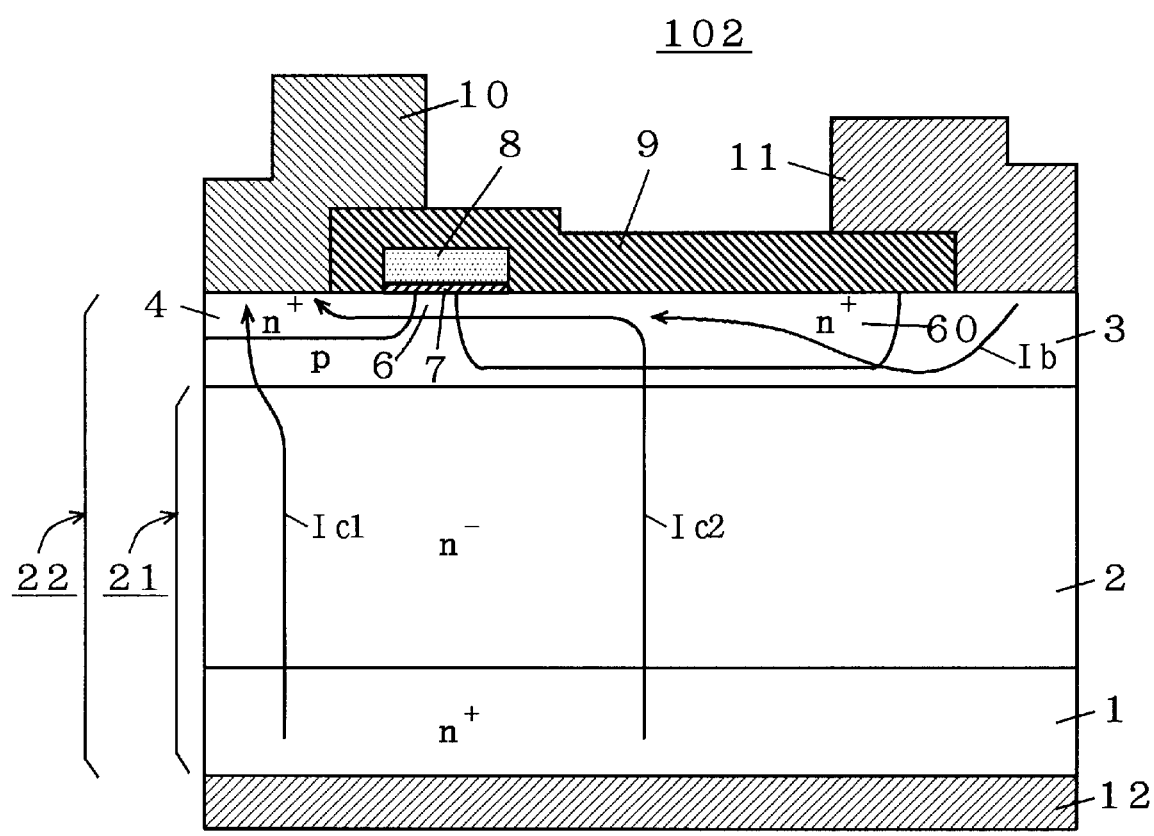
FIG. 16 is a front sectional view of a cell region of a device of an embodiment 1.

FIG. 16 is a sectional view of a transistor of an embodiment 2. An upper surface of this transistor 102 is shown by the plan view of FIG. 2, similarly to the device 101. FIG. 16 corresponds to a sectional view along the V—V cutting-plane line in FIG. 2.

As shown in FIG. 16, the transistor 102 is characteristically different from the transistor 101 at a point that a second emitter layer 60 is formed more deeply than a first emitter layer 4. This characteristic increases the ration of a second collector current $I_{C2}$ to a first collector current $I_{C1}$, and brings further improvement of a turn-off characteristic.

Figure 17:
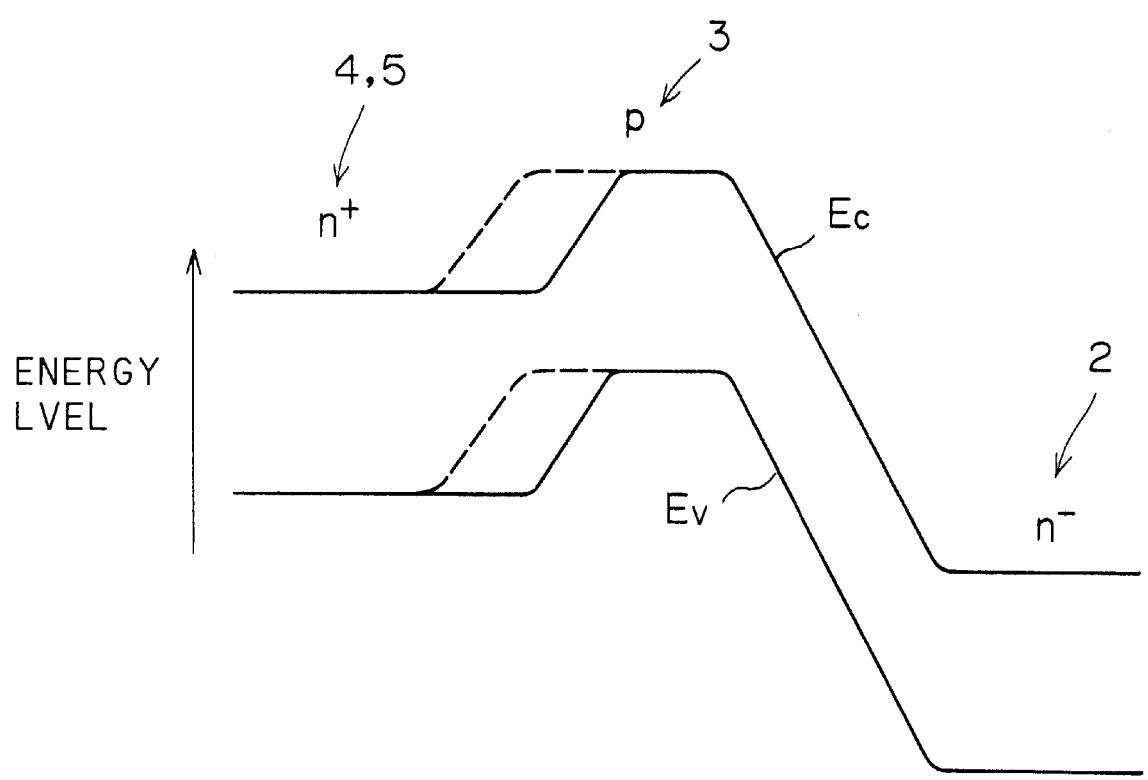
FIG. 17 is a band diagram of the device of the embodiment 2.

FIG. 17 is a band diagram of a second transistor which is a part taking charge of the second collector current $I_{C2}$ in a unit cell. For the purpose of comparison, the conduction band infimum $E_C$ and the valence band supremum $E_V$ at the time when a second emitter layer 60 has the same depth as the first emitter layer 4 are shown by dotted lines. Due to the fact that the second emitter layer 60 is deeply formed, a part of a base layer 3 held by the second emitter layer 60 and an n⁻ layer 2 thins. Consequently, the widths of regions having high energy level contributing as barriers narrow, as shown in FIG. 17.

Therefore, the second collector current $I_{C2}$ flowing through the second transistor enlarges when supplying a base current $I_b$. Consequently, the ratio of the first collector current $I_{C1}$ to the second collector current $I_{C2}$ lowers, whereby the turn-off characteristic is improved. It is possible to suppress the first collector current $I_{C1}$ low to a degree negligible as compared with the second collector current $I_{C2}$. Due to this, it is possible to shorten the turn-off time of the transistor 102 equivalently to the turn-off time of the MOS 151 or the IGBT 153 while lowly maintaining an ON-state voltage equivalently low to the BIP 152.

Figure 18:
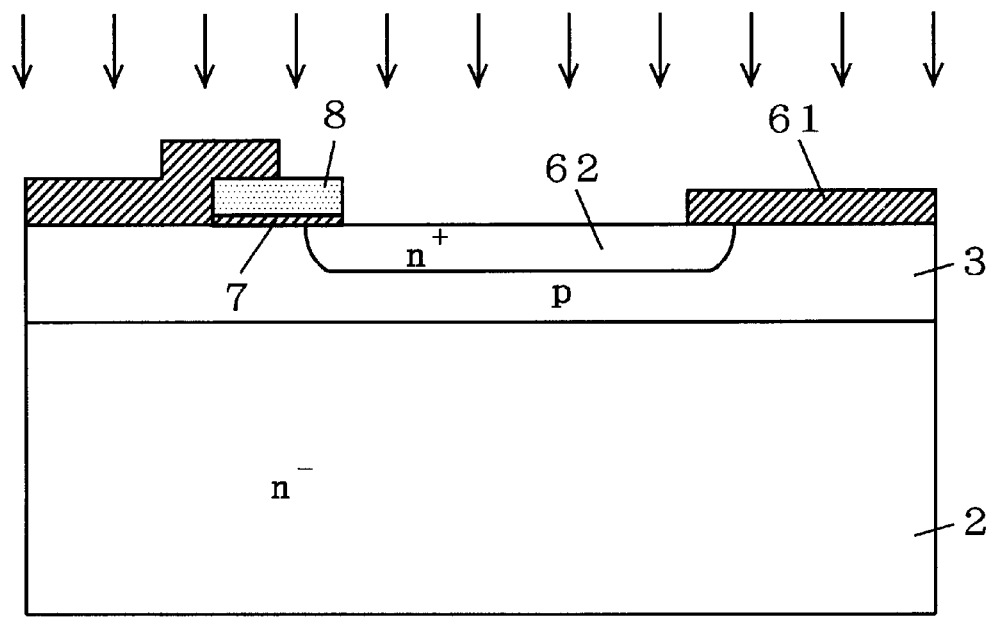
FIG. 18 is a fabrication step diagram of the device of the embodiment 2.
Figure 19:
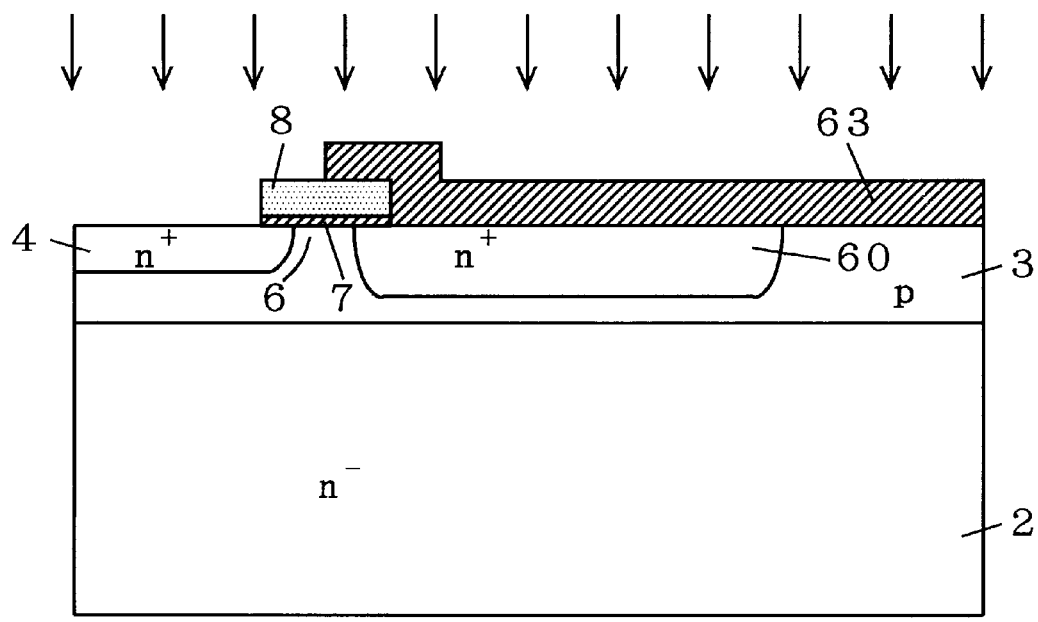
FIG. 19 is a fabrication step diagram of the device of the embodiment 2.

FIG. 18 and FIG. 19 are fabrication step diagrams showing a preferable example of a fabrication method of the transistor 102. In order to fabricate the transistor 102, the step shown in FIG. 8 to FIG. 12 are first executed.

Then, a screen 61 is formed on an upper surface of a semiconductor base body, as shown in FIG. 18. The screen 61 is so patterned as to define an opening part corresponding to the second emitter layer 60 (FIG. 16) in cooperation with a gate electrode 8. These gate electrode 8 (and a gate insulating film 7) and screen 61 are employed as masks, thereby selectively implanting an n-type impurity into an upper surface part of the base layer 3. Subsequently, the screen 61 is removed, and thereafter the n-type impurity is diffused by performing annealing. Consequently, an n layer 62 forming the basis of the second emitter layer 60 is selectively formed on the upper surface part of the base layer 3.

Then, a screen 63 is formed on the upper major surface of the semiconductor base body, as shown in FIG. 19. The screen 63 is so patterned as to define an opening part corresponding to the first emitter layer 4 (FIG. 16) in cooperation with the gate electrode 8. These gate electrode 8 (and the gate insulating film 7) and screen 63 are employed as masks, thereby selectively implanting an n-type impurity into the upper surface part of the base layer 3. Subsequently, the screen 63 is removed, and thereafter the n-type impurity is diffused by performing annealing.

Consequently, the first emitter layer 4 is selectively formed on the upper surface part of the base layer 3, and the second emitter layer 60 is selectively formed by further diffusion of the n layer 62 at the same time. The second emitter layer 60 doubly subjected to diffusion is formed more deeply than the first emitter layer 4.

Then, the steps of FIG. 14 and FIG. 15 are executed and thereafter a collector electrode 12 is formed on a lower major surface of the semiconductor base body 22, i.e., on a surface of an N+ layer 1 returning to FIG. 16, whereby the transistor 102 is completed. As hereinabove described, the transistor 102 can be readily obtained by employing the deposition step and the ordinary wafer process mainly composed of the implantation and diffusion steps of the impurities in combination, similarly to the transistor 101.

3. Embodiment 3

A transistor of an embodiment 3 is now described.

3-1. Structure and Operation

FIG. 20 is a sectional view of the transistor of the embodiment 3. An upper surface of this transistor 103 is also shown by the plan view of FIG. 2, similarly to the transistors 101 and 102. The section of FIG. 20 corresponds to a section along the V—V cutting-plane line in FIG. 2.

As shown in FIG. 20, the transistor 103 is characteristically different from the transistor 101 at a point that a p layer (sixth semiconductor layer) 13 containing a p-type impurity is selectively formed on an upper surface part of a first emitter layer 4. This characteristic brings improvement of a withstand voltage to the transistor 103.

The p layer 13 is formed to extend over a region held between a gate electrode 8 and an emitter electrode 10 in the upper surface part of the first emitter layer 4. Moreover, an end portion of the p layer 13 on the side of the emitter electrode 10 is formed to be positioned in a region immediately under the emitter electrode 10. Therefore, the emitter electrode 10 is connected to both of the first emitter layer 4 and the p layer 13.

Further, an end portion of the p layer 13 on the side of the gate electrode 8 is so formed as not to separate from immediately under the gate electrode 8 to the side of the emitter electrode 10 and moreover not to reach an end portion of the first emitter layer 4 positioned immediately under the gate electrode 8. Therefore, the first emitter layer 4 is exposed on the upper major surface of the semiconductor base body 23 in a region held between the p layer 13 and the base layer 3, and moreover, this exposed surface is opposed to the gate electrode 8 without jutting out from immediately under the gate electrode 8. Therefore, this exposed surface functions as a channel region 65. Preferably, the p layer 13 contains a p-type impurity in higher concentration than the base layer 3.

If reverse bias (negative voltage) is applied to the gate electrode 8 when the transistor 103 is in an OFF state, the channel region 65 held between the p layer 13 and the base layer 3 is inverted to a p type. Consequently, the base layer 3 is short-circuited to the emitter electrode 10 through the p layer 13 and the inverted channel region 65.

In general, there is such a property in a bipolar transistor that a collector-emitter withstand voltage $V_{CES}$ at the time when a base electrode 11 is short-circuited to the emitter electrode 10 is high as compared with a collector-to-emitter withstand voltage $V_{CEO}$ at the time when the base electrode 11 is opened. In the transistor 103, the base layer 3 is short-circuited to the emitter electrode 10 by applying reverse bias to the gate electrode 8, whereby a high value corresponding to the withstand voltage $V_{CES}$ is attained as the collector-to-emitter withstand voltage even if the base electrode 11 is in an open state. Or, it is possible to thinly set the thickness of an n− layer 2, for implementing a required withstand voltage.

3-2. Verification of Characteristics

Results obtained by verifying the characteristics of the transistor of the embodiment are now described. The verification was performed by executing simulation employing a commercially available device simulator known with the name of "MEDIC".

Figure 21:
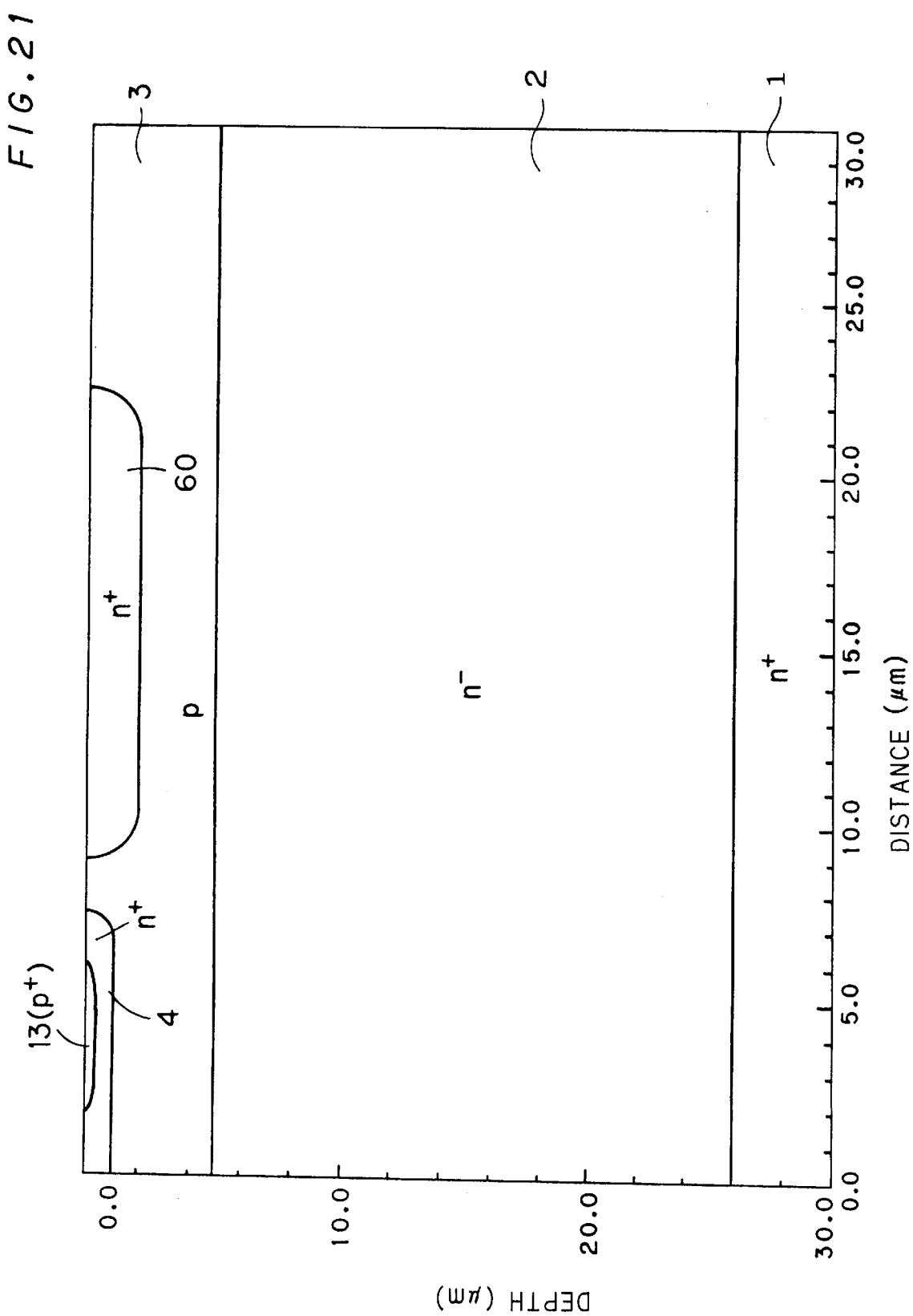
FIG. 21 is a front sectional view of a device regarded as an object of simulation.

FIG. 21 is a sectional view showing the structure of a transistor regarded as the object of the simulation. As shown in FIG. 21, a second emitter layer 60 deeper than a first emitter layer 4 is comprised in this transistor, and moreover a p layer 13 is comprised. Namely, this transistor has both characteristics of the transistor 102 and the transistor 103.

In relation to an n− layer 2, the impurity concentration is set at $5 \times 10^{15}$ cm$^{−3}$, and the thickness is set at 23 μm. As to a base layer 3, the impurity concentration of a surface is set at $5 \times 10^{17}$ cm$^{−3}$, and the depth is set at 5 μm. Each of the impurity concentration of surfaces of the first and second emitter layers 4 and 60 and a surface of an N+ layer 1 is set at $1 \times 10^{19}$ cm$^{−3}$.

Figure 22:
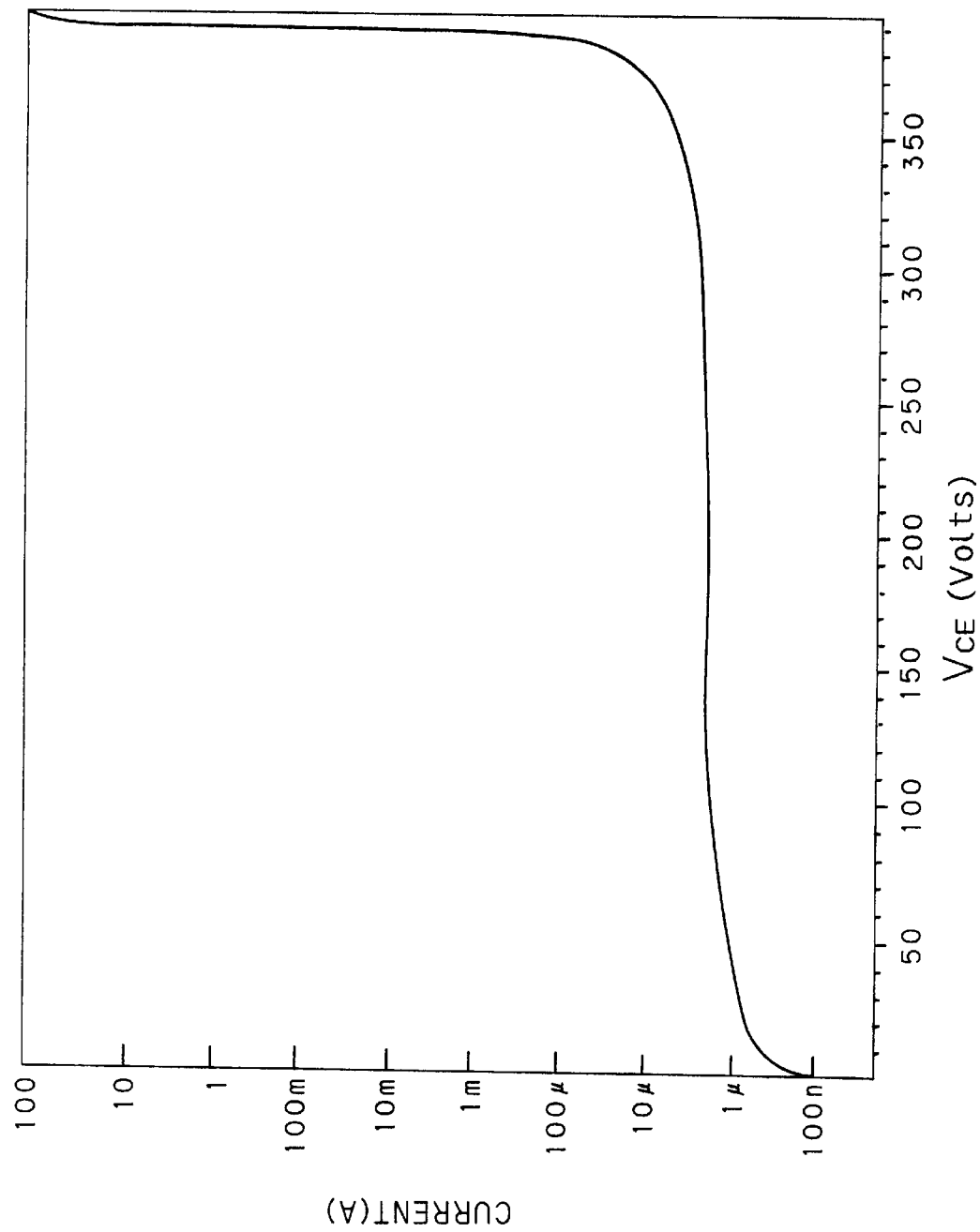
FIG. 22 is a graph showing a result of simulation related to a withstand voltage.

FIG. 22 is a graph showing a result of simulation related to a withstand voltage. This result was obtained under conditions of applying reverse bias to a gate electrode 8 and opening a base electrode 11. It is possible to read that the withstand voltage is about 380 V from FIG. 22. This value is substantially identical to the withstand voltage of a diode formed by the base layer 3 and the n− layer 2. This result verifies that the withstand voltage is improved by the fact that the base layer 3 is short-circuited to an emitter electrode 10 through a p layer 13 and a channel region 65.

Figure 23:
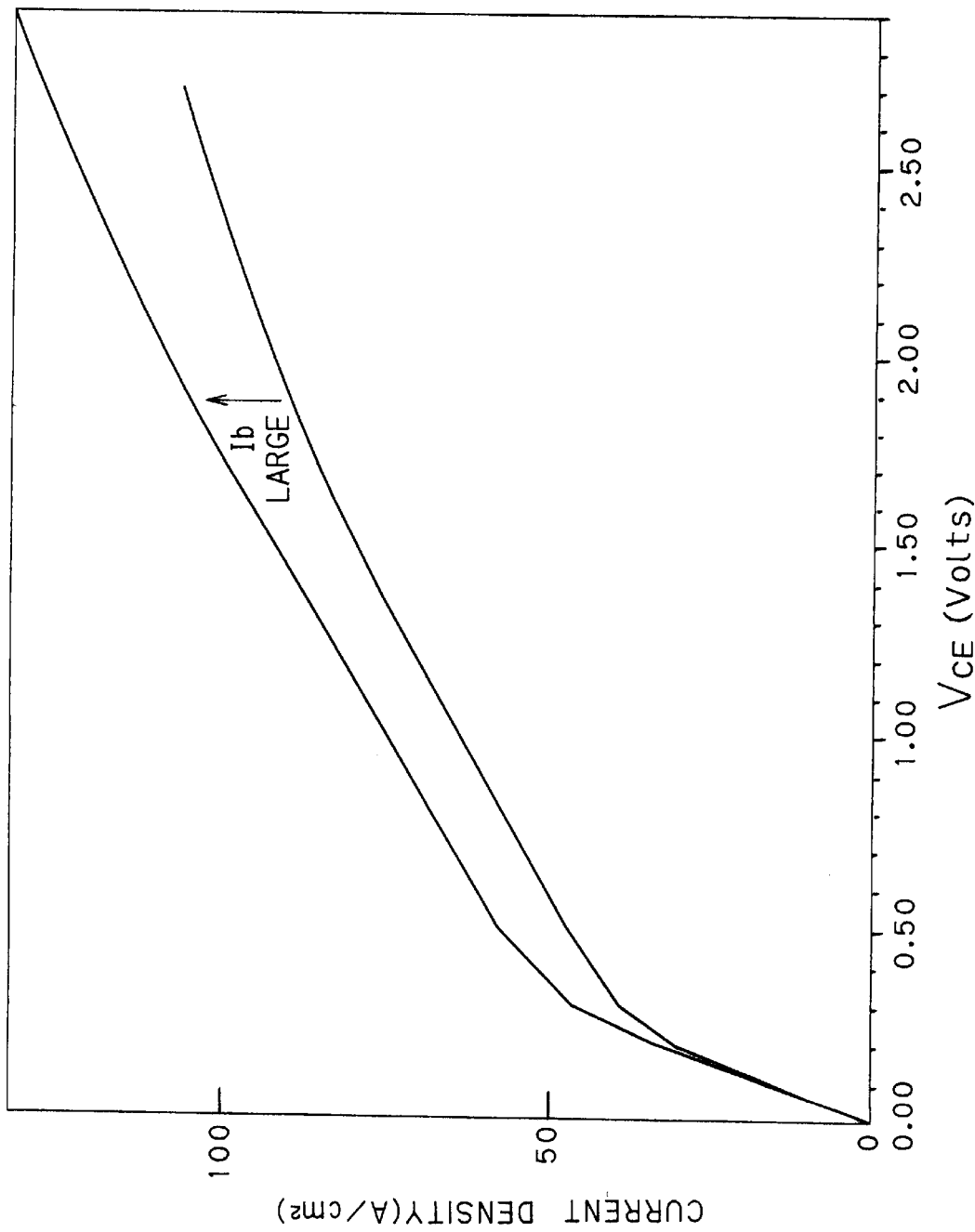
FIG. 23 is a graph showing a result of simulation related to an output characteristic.

FIG. 23 is a graph showing results of simulation related to an output characteristic. In FIG. 23, two curves show the relation between collector current density and a collector voltage $V_{CE}$ with respect to two different base currents $I_b$. As obvious when comparing these curves with the three curves drawn in FIG. 40, the output characteristic of the transistor regarded as the object of simulation is substantially equivalent to the output characteristic of the BIP 152. Therefore, a low value substantially equivalent to the BIP 152 is obtained as an ON-state voltage.

Figure 24:
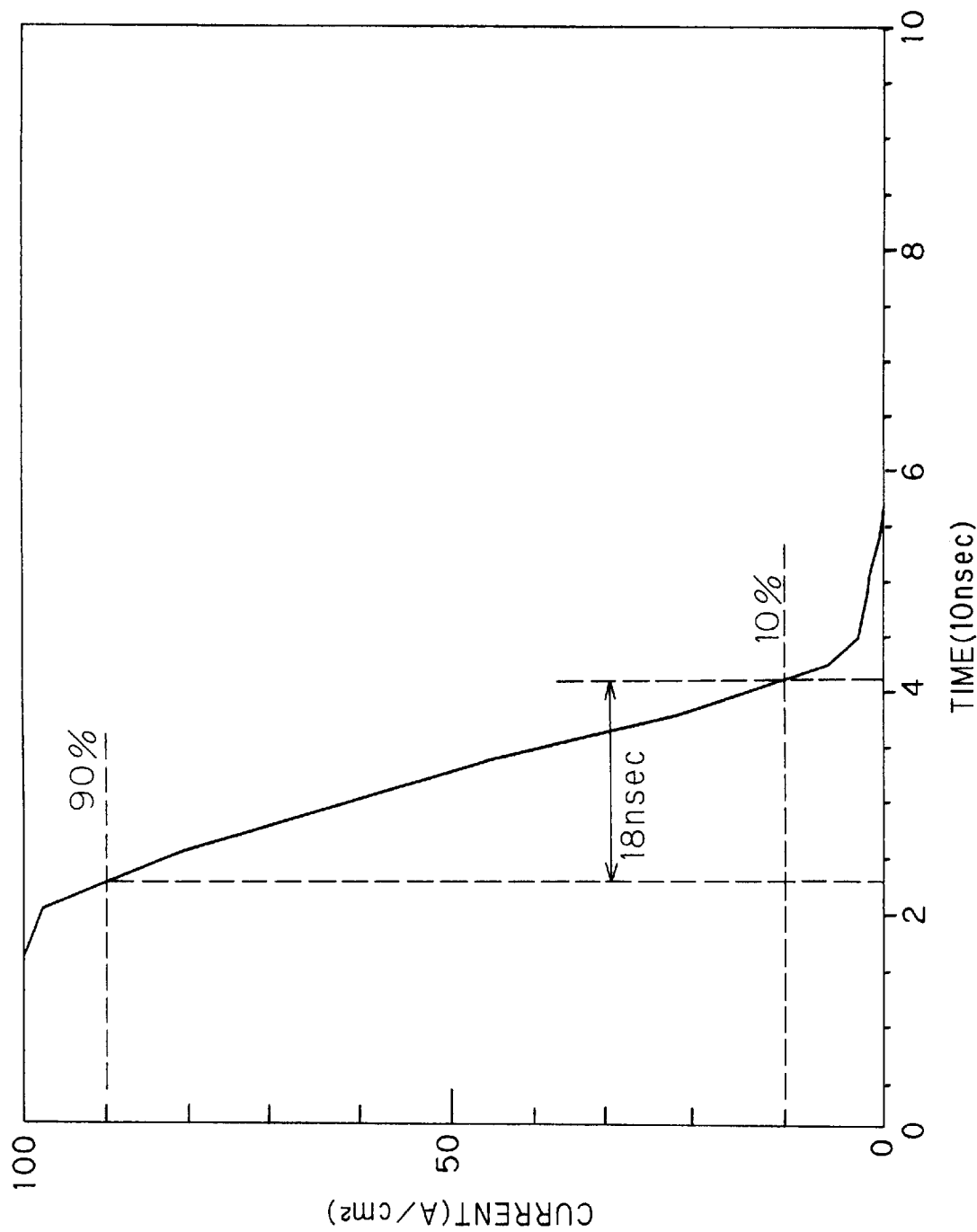
FIG. 24 is a graph showing a result of simulation related to a turn-off characteristic.

FIG. 24 is a graph showing a result of simulation related to a turn-off characteristic. In the simulation, 100 A/cm$^2$ which is representative magnitude was selected as an initial value of collector current density. A turn-off time is defined as a period from a point of time when it attenuates to 90% with respect to the value of a collector current immediately before turn-off up to attenuation to 10%.

FIG. 24 shows that the turn-off time of the transistor regarded as the object of simulation is 18 nsec. This value rivals the turn-off time of the MOS 151 or the IGBT 153.

As hereinabove described, it has been verified that a short turn-off time can be implemented equivalently to the MOS 151 or the IGBT 153 while maintaining the ON-state voltage equivalently low to the BIP 152 by comprising the characteristics of the transistor 102. At the same time, it has also been verified that a high value equivalent to the withstand voltage $V_{CES}$ is obtained as the withstand voltage $V_{CEO}$ by comprising the characteristics of the transistor 103.

3-3. Fabrication Method

Figure 25:
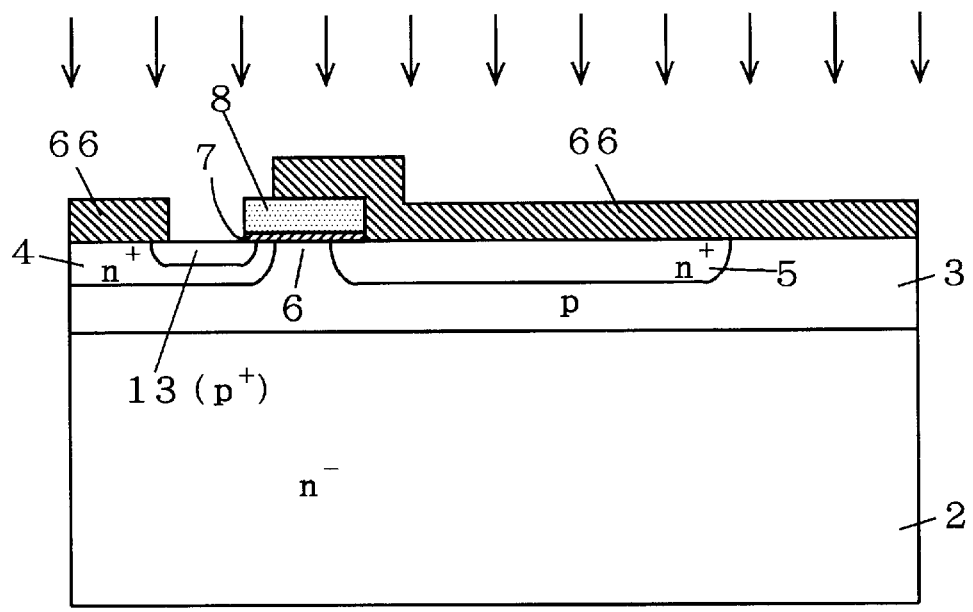
FIG. 25 is a fabrication step diagram of a device of an embodiment 3.

A method suitable for fabrication of the transistor 103 is now described. In order to fabricate the transistor 103, the steps shown in FIG. 8 to FIG. 13 are first executed. Then, a screen 66 is formed on an upper major surface of a semiconductor base body, as shown in FIG. 25. The screen 66 is so patterned as to define an opening part corresponding to the p layer 13 (FIG. 20) in cooperation with the gate electrode 8.

Then, these gate electrode 8 (and the gate insulating film 7) and screen 66 are employed as masks, thereby selectively implanting a p-type impurity into an upper surface part of the first emitter layer 4. Subsequently, the screen 66 is removed, and thereafter the p-type impurity is diffused by performing annealing. Consequently, the p layer 13 is selectively formed on the upper surface part of the first emitter layer 4. The first emitter layer 4 and the p layer 13 are formed in common by employing the gate electrode 8 as a part of the screen, whereby the positional relation between the gate electrode 8, the first emitter layer 4 and the p layer 13 is properly settled in a self alignment manner.

Subsequently, the steps of FIG. 14 and FIG. 15 are executed, and thereafter a collector electrode 12 is formed on a lower major surface of the semiconductor base body 23, i.e., a surface of an N$^+$ layer 1 returning to FIG. 20, whereby the transistor 103 is completed. As hereinabove described, the transistor 103 can be readily obtained by employing the deposition step and the ordinary wafer process mainly composed of the implantation and diffusion steps of the impurities in combination, similarly to the transistors 101 and 102.

4. Embodiment 4

Figure 26:
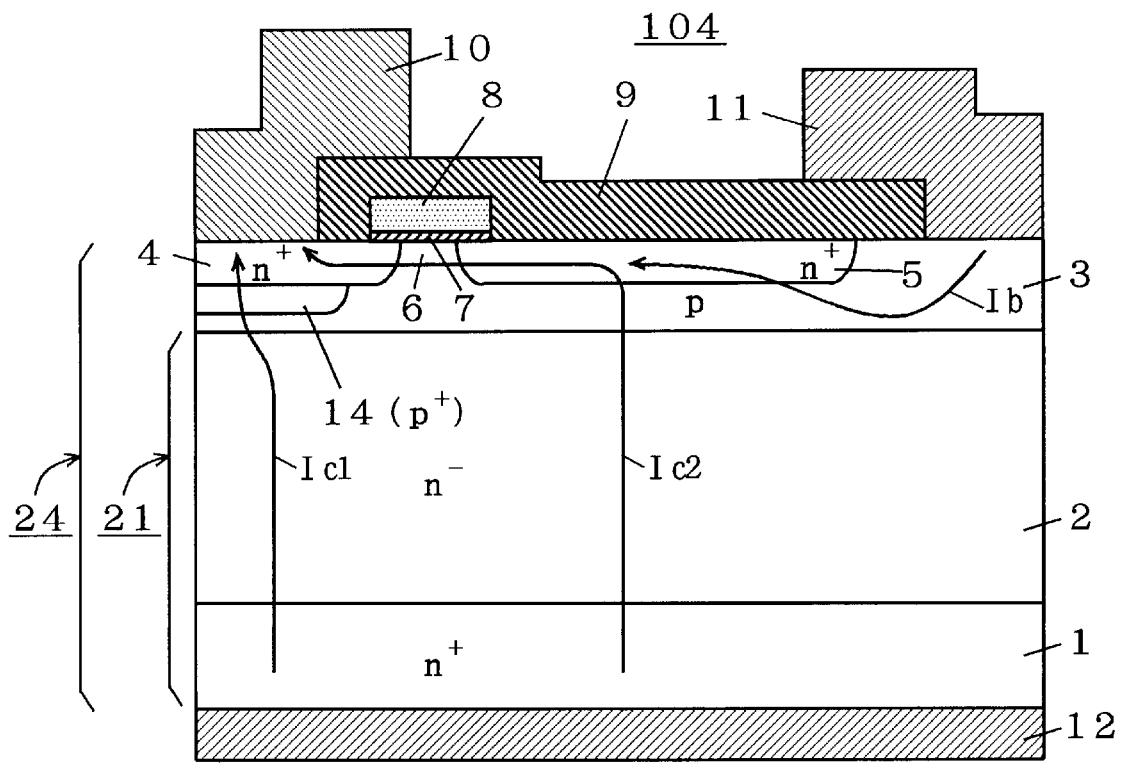
FIG. 26 is a front sectional view of a device of an embodiment 4.

FIG. 26 is a sectional view of a transistor of an embodiment 4. An upper surface of this transistor 104 is also shown by the plan view of FIG. 2, similarly to the transistors 101 to 103. The section of FIG. 26 corresponds to a section along the V—V cutting-plane line in FIG. 2.

As shown in FIG. 26, the transistor 104 is characteristically different from the transistor 101 at a point that a p$^+$ layer (fifth semiconductor layer) 14 containing a p-type impurity in higher concentration than a base layer 3 is formed adjacently to a bottom portion of a first emitter layer 4. This characteristic increases the ratio between a second collector current $I_{C2}$ to a first collector current $I_{C1}$ and brings further improvement of a turn-off characteristic, similarly to the transistor 102 of the embodiment 2.

Figure 27:
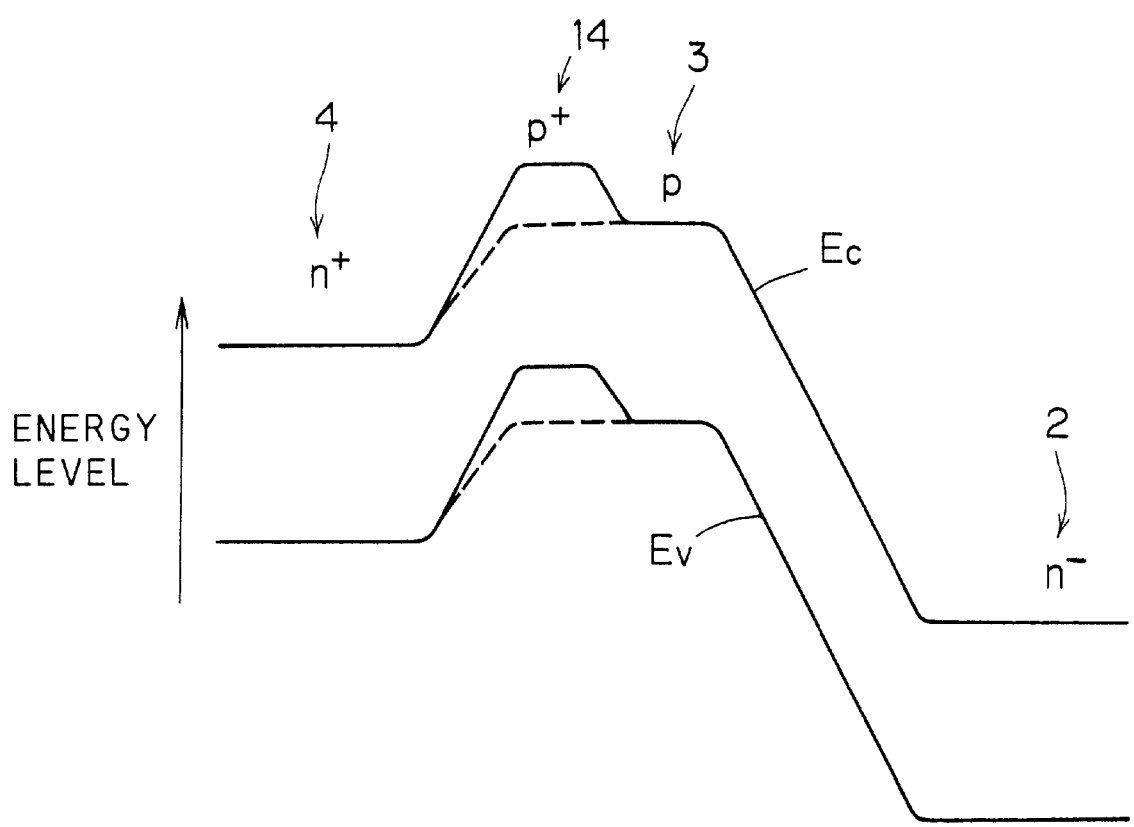
FIG. 27 is a band diagram of the device of the embodiment 4.

FIG. 27 is a band diagram of a first transistor which is a part taking charge of the first collector current $I_{C1}$ in a unit cell. For the purpose of comparison, the conduction band infimum $E_C$ and the valence band supremum $E_V$ at the time when no p$^+$ layer 14 is formed are shown by dotted lines. Due to the formation of the p$^+$ layer 14, the conduction band infimum $E_C$ and the valence band supremum $E_V$ rise in a portion corresponding to the p$^+$ layer 14 in the base layer 3. Namely, the p$^+$ layer 14 serves a function of further increasing an energy barrier intervening between the first emitter layer 4 and an n$^-$ layer 2 at least in a part thereof.

Therefore, the first collector current $I_{C1}$ flowing through the first transistor when supplying a base current $I_b$ lowers. Consequently, the ratio of the first collector current $I_{C1}$ to the second collector current $I_{C2}$ lowers, whereby the turn-off characteristic is improved. It is possible to suppress the first collector current $I_{C1}$ low to a degree negligible as compared with the second collector current $I_{C2}$ by properly setting the depth or the impurity concentration of the p$^+$ layer 14. Due to this, the turn-off time of the transistor 104 can be shortened equivalently to the turn-off time of the MOS 151 or the IGBT 153 while maintaining an ON-state voltage equivalently low to the BIP 152.

It is also possible to express the relation between the first collector current $I_{C1}$ and the second collector current $I_{C2}$ with apparent current amplification factors of the first and second transistors. Namely, a first current amplification factor $h_{fe1}$ which is the apparent current amplification factor of the first transistor is defined by $h_{fe1}=I_{c1}/I_b$, and a second current amplification factor $h_{fe2}$ which is the apparent current amplification factor of the second transistor is defined by $h_{fe2}=I_{C2}/I_b$.

Following this definition, it is possible to replace the relation between the first collector current $I_{C1}$ and the second collector current $I_{C2}$ with the relation between the first current amplification factor $h_{fe1}$ and the second current amplification factor $h_{fe2}$ as such. For example, it is possible to express the relation $I_{C1}<I_{C2}$ as $h_{fe1}<h_{fe2}$.

As hereinabove described, the relation $I_{C1}<<I_{C2}$ (the first collector current $I_{C1}$ is sufficiently small as compared with the second collector current $I_{C2}$) is implementable by properly forming the second emitter layer 60 (FIG. 16) or the p$^+$ layer 14 (FIG. 26), and this can simultaneously be expressed that the relation $h_{fe1}<<h_{fe2}$ (the first current amplification factor $h_{fe1}$ is sufficiently small as compared with the second current amplification factor $h_{fe2}$) is implementable.

It is possible to form both of the second emitter layer 60 which is the characteristic of the transistor 102 and the p$^+$ layer 14 which is the characteristic of the transistor 104 in one transistor, and the turn-off characteristic can be further effectively improved by doing so.

Figure 28:
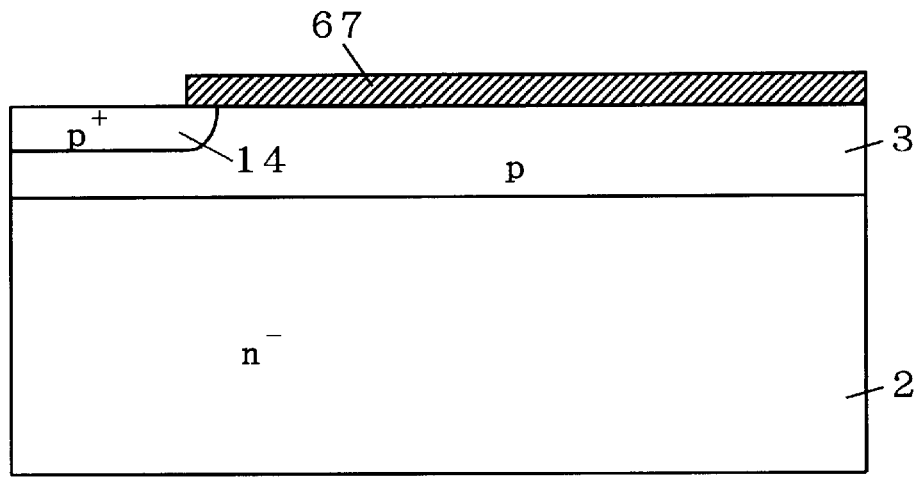
FIG. 28 is a fabrication step diagram of the device of the embodiment 4.

A method suitable for fabrication of the transistor 104 is now described. In order to fabricate the transistor 104, the steps shown in FIG. 8 to FIG. 10 are first executed. Then, a screen 67 is formed on an upper major surface of a semiconductor base body, as shown in FIG. 28. The screen 67 has an opening part for the p$^+$ layer 14. This screen 67 is employed as a mask, thereby selectively implanting a p-type impurity into an upper surface part of the base layer 3. Subsequently, the screen 67 is removed, and thereafter the p-type impurity is diffused by performing annealing. Consequently, the p$^+$ layer 14 is selectively formed on the upper surface part of the base layer 3.

Then, the steps of FIG. 11 to FIG. 15 are executed, and thereafter a collector electrode 12 is formed on a lower major surface of the semiconductor base body 24, i.e., on a surface of an N$^+$ layer 1 returning to FIG. 26, whereby the transistor 104 is completed. As hereinabove described, the transistor 104 can be readily obtained by employing the deposition step and the ordinary wafer process mainly composed of the implantation and diffusion steps of the impurities in combination, similarly to the transistors 101 to 103.

5. Embodiment 5

Figure 29:
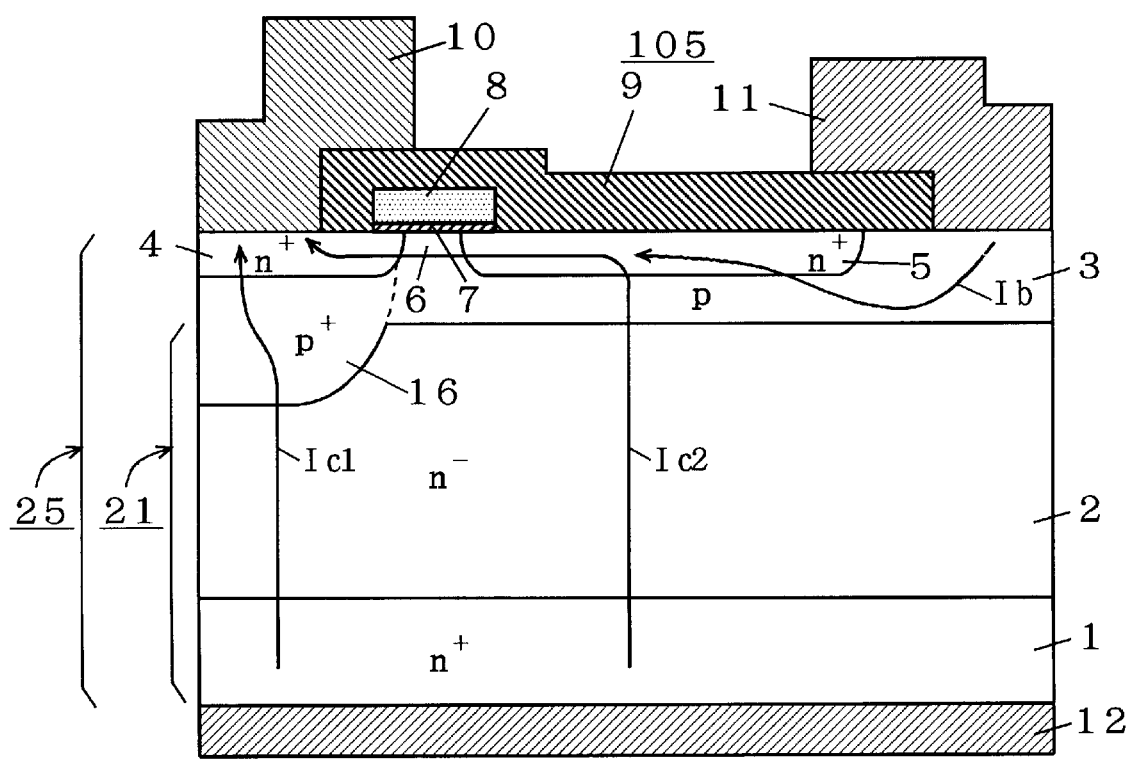
FIG. 29 is a front sectional view of a device of an embodiment 5.

FIG. 29 is a sectional view of a transistor of an embodiment 5. An upper surface of this transistor 105 is also shown by the plan view of FIG. 2, similarly to the transistors 101 to 104. The section of FIG. 29 corresponds to a section along the V—V cutting-plane line in FIG. 2.

As shown in FIG. 29, the transistor 105 is characteristically different from the transistor 101 at a point that a p$^+$ layer (fifth semiconductor layer) 16 containing a p-type impurity in higher concentration than a base layer 3 is adjacently formed to a bottom portion of a first emitter layer 4. Further, the p$^+$ layer 16 is also characteristically different from the transistor 104 at a point being formed more deeply than the base layer 3. The p⁺ layer 16 further effectively increases the ratio between a second collector current $I_{C2}$ to a first collector current $I_{C1}$ and further effectively improves a turn-off characteristic as compared with the p⁺ layer 14.

Figure 30:
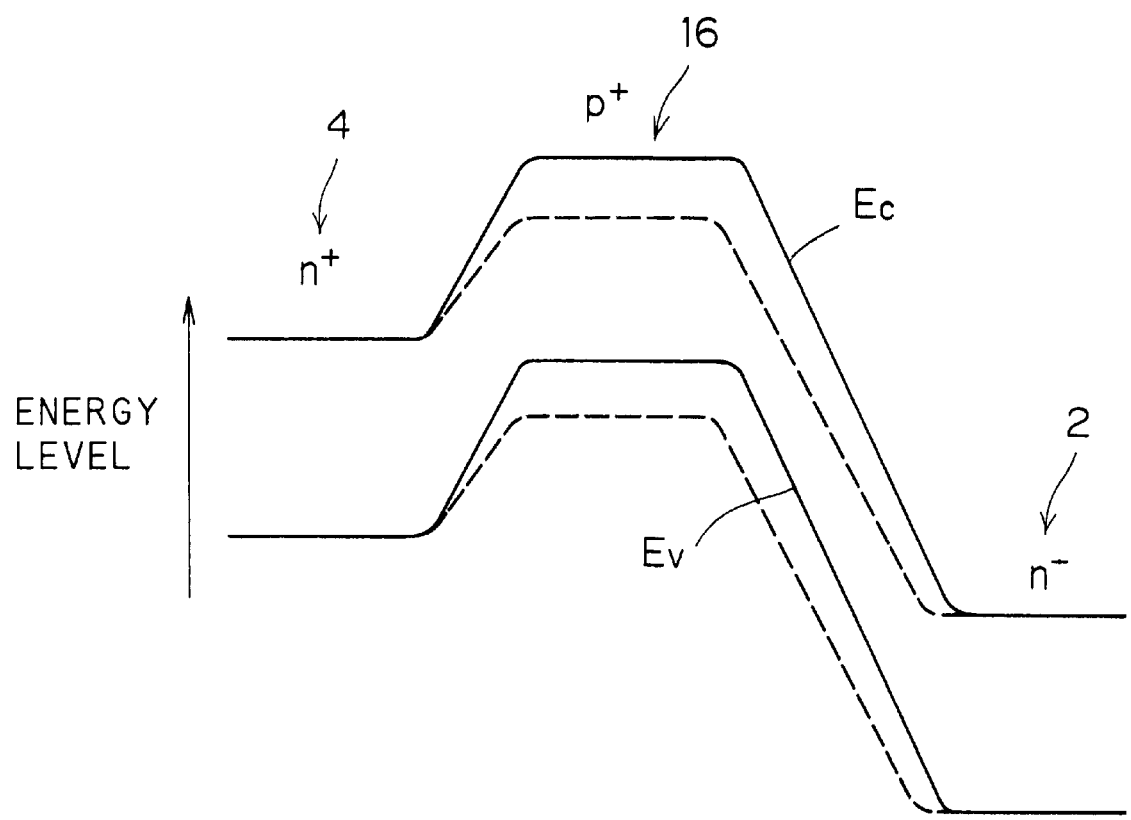
FIG. 30 is a band diagram of the device of the embodiment 5.

FIG. 30 is a band diagram of a first transistor which is a part taking charge of the first collector current $I_{C1}$ in a unit cell. For the purpose of comparison, the conduction band infimum $E_C$ and the valence band supremum $E_V$ at the time when no p⁺ layer 16 is formed are shown by dotted lines. Due to the formation of the p⁺ layer 16, the energy barrier rises over the entire base layer 3, and the width of the energy barrier further spreads beyond the range of the base layer 3.

Therefore, the first collector current $I_{C1}$ is suppressed further effectively low as compared with the transistor 104 whose energy barrier rises in the range of the base layer 3. Consequently, the ratio of the first collector current $I_{C1}$ to the second collector current $I_{C2}$ further lowers, whereby the turn-off characteristic is further improved.

It is possible to suppress the first collector current $I_{C1}$ low to a degree negligible as compared with the second collector current $I_{C2}$ by properly setting the depth or the impurity concentration of the p⁺ layer 16. Namely, it is possible to render $I_{C1} \ll I_{C2}$, or $h_{fe1} \ll h_{fe2}$. Due to this, the turn-off time of the transistor 105 can be shortened equivalently to the turn-off time of the MOS 151 or the IGBT 153 while maintaining an ON-state voltage equivalently low to the BIP 152.

It is possible to provide both of the second emitter layer 60 which is the characteristic of the transistor 102 and the p⁺ layer 16 which is the characteristic of the transistor 105 in one transistor, and the turn-off characteristic can be further effectively improved by doing so.

Figure 31:
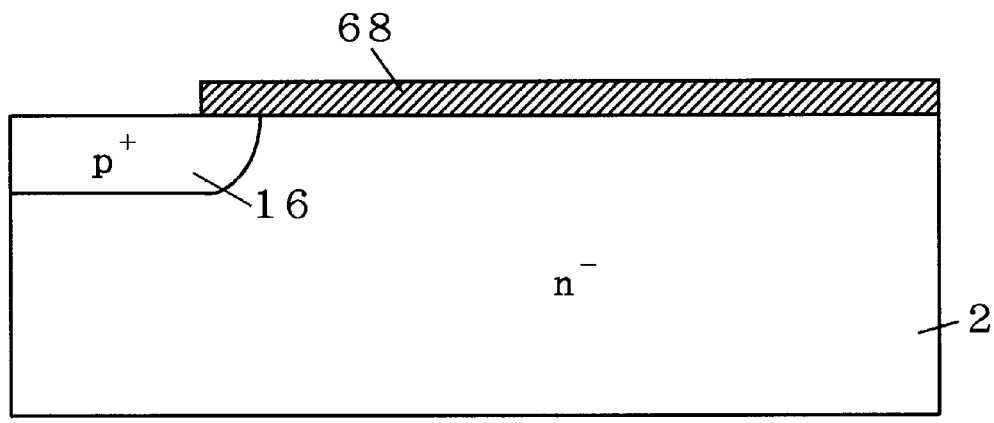
FIG. 31 is a fabrication step diagram of the device of the embodiment 5.

A method suitable for fabrication of the transistor 105 is now described. In order to fabricate the transistor 105, the steps shown in FIG. 8 to FIG. 9 are first executed. Then, a screen 68 is formed on an upper major surface of a semiconductor base body, as shown in FIG. 31. The screen 68 has an opening part for the p⁺ layer 16.

This screen 68 is employed as a mask, thereby selectively implanting a p-type impurity into an upper surface part of an n⁻ layer 2. Subsequently, the screen 68 is removed, and thereafter the p-type impurity is diffused by performing annealing. Consequently, the p⁺ layer 16 is selectively formed on the upper surface part of the n⁻ layer 2.

Then, the steps of FIG. 10 to FIG. 15 are executed. The quantity of the p-type impurity introduced in FIG. 31 is so set that the impurity concentration of the p⁺ layer 16 higher than the p-type impurity concentration of the base layer 3 formed in the following step of FIG. 10. The step of FIG. 9 and the step of FIG. 31 may be executed in reverse order. Or, the step of FIG. 9 and the step of FIG. 31 may be simultaneously executed with a single screen, as shown in FIG. 32.

Figure 32:
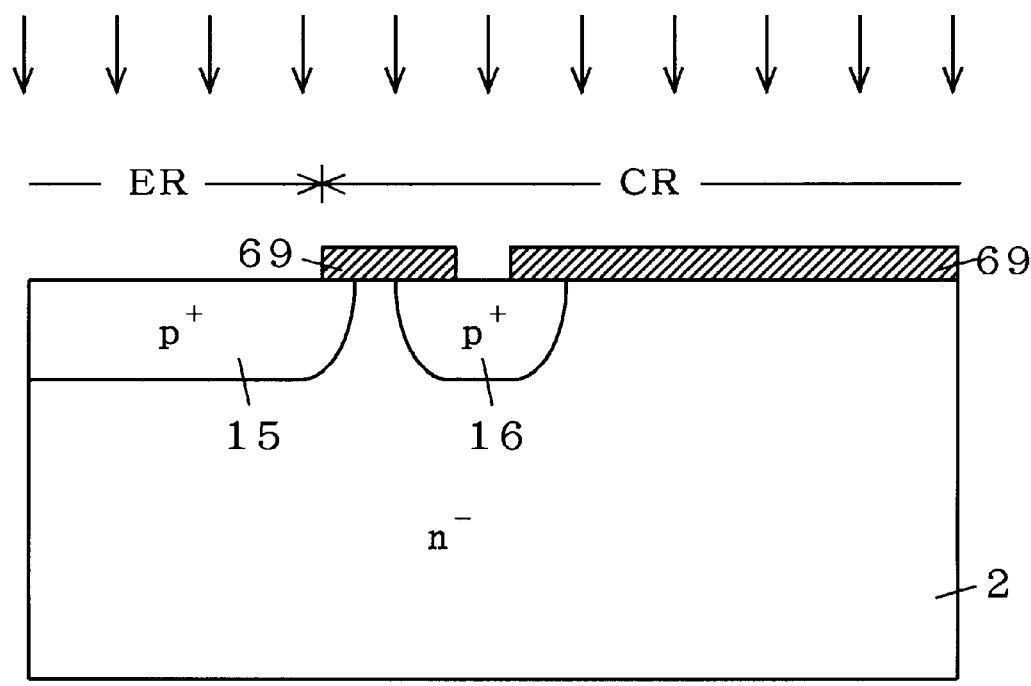
FIG. 32 is a fabrication step diagram of the device of the embodiment 5.

In the step of FIG. 32, a screen 69 is formed on the upper major surface of the semiconductor base body. The screen 69 has both of an opening part for the p⁺ layer 16 and an opening part for a p region 15. This screen 69 is employed as a mask, thereby selectively implanting a p-type impurity into the upper surface part of the n⁻ layer 2. Then, the screen 69 is removed, and thereafter the p-type impurity is diffused by performing annealing. Consequently, the p region 15 and the p⁺ layer 16 are simultaneously formed on the upper surface part of the n⁻ layer 2.

When the step of FIG. 15 ends, the transistor 105 is completed by forming a collector electrode 12 on a lower major surface of the semiconductor base body 25, i.e., on a surface of an N⁺ layer 1 returning to FIG. 29. As hereinabove described, the transistor 105 can be readily obtained by employing the deposition step and the ordinary wafer process mainly composed of the implantation and diffusion steps of the impurities in combination, similarly to the transistors 101 to 104.

Figure 33:
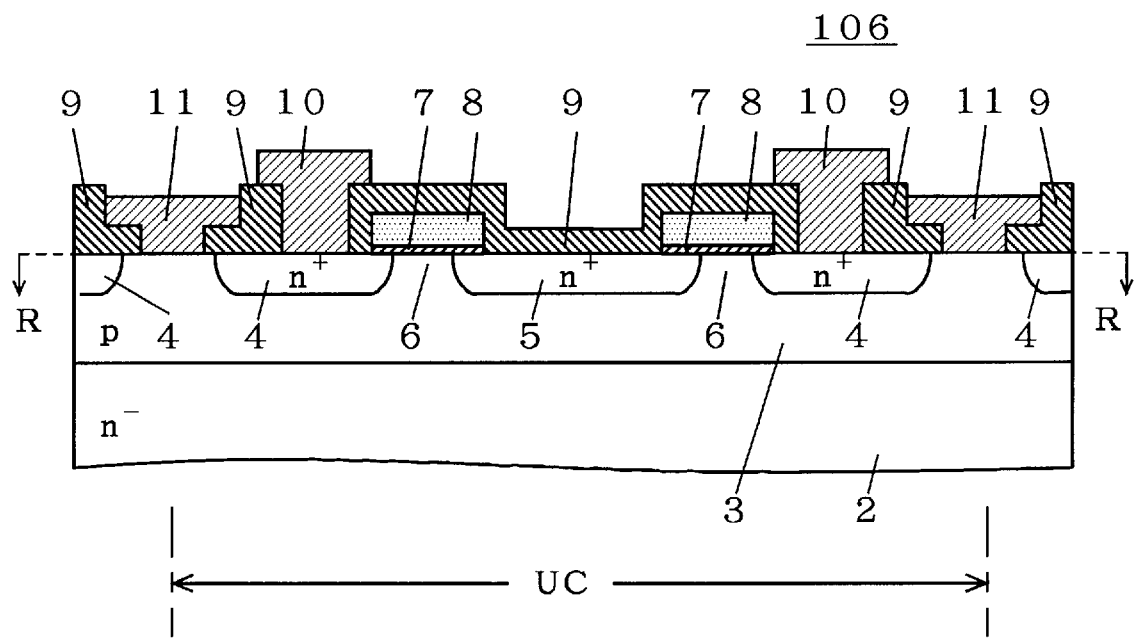
FIG. 33 is a front sectional view of a cell region of a device of a modification (1).
Figure 34:
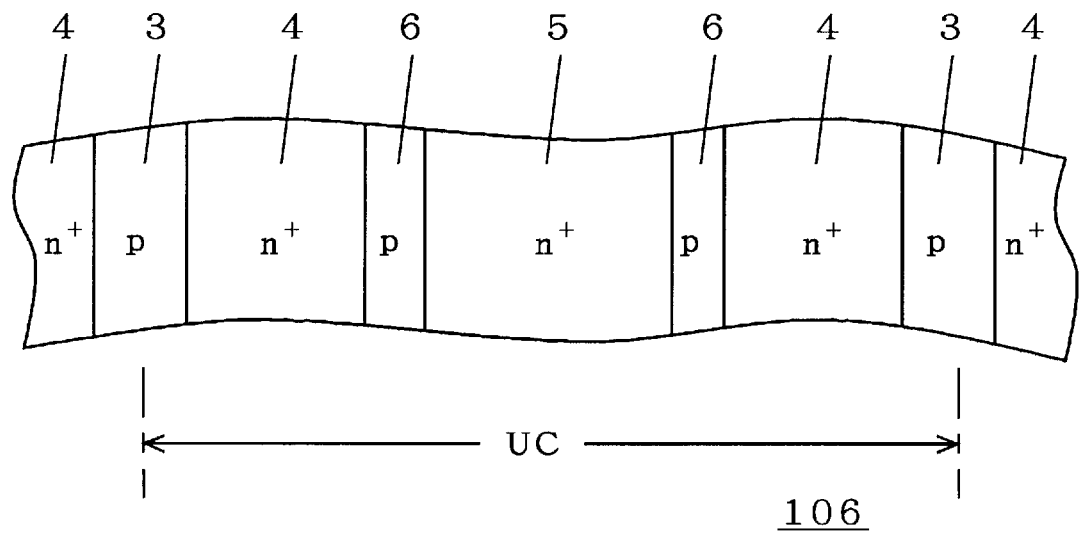
FIG. 34 is a sectional view of the device of the modification (1) along an R—R cutting-plane line.

6. Modifications (1) FIG. 33 is a sectional view of a transistor of a modification 1. An upper surface of this transistor 106 is also shown by the plan view of FIG. 2, similarly to the transistors 101 to 105. The section of FIG. 33 corresponds to a section along the V—V cutting-plane line in FIG. 2. FIG. 34 is a sectional view along an R—R cutting-plane line in FIG. 33. Namely, these FIG. 33 and FIG. 34 are compared with FIG. 4 and FIG. 5 related to the transistor 101 respectively.

As shown in FIG. 33 and FIG. 34, a single second emitter layer 5 and two first emitter layers 4 are included in one unit cell UC. These first and second emitter layers 4 and 5 are so arranged that the two first emitter layers 4 hold both sides of the single second emitter layer 5 through an exposed surface of a base layer 3.

In the exposed surface of the base layer 3, channel regions 6 are formed on portions adjacent to both sides of the second emitter layer 5, and base electrodes 11 are connected to portions held by the two first emitter layers 4. Dissimilarly to the transistor 101, therefore, neither the second emitter layer 5 nor the channel regions 6 are present between emitter electrodes 10 to which the first emitter layers 4 are connected and the base electrodes 11. The emitter electrodes 10 and the base electrodes 11 are adjacent to each other through interlayer isolation films 9.

Also when the first and second emitter layers 4 and 5 are thus arranged, reduction of an ON-state voltage and improvement of a turn-off characteristic are compatibly implemented. As described in embodiment 1, however, such an advantage that refinement of the unit cell UC is easy is attained in addition to the fact that the turn-off characteristic can be further improved by arranging the first and second emitters 4 and 5 similarly to the transistor 101.

Figure 35:
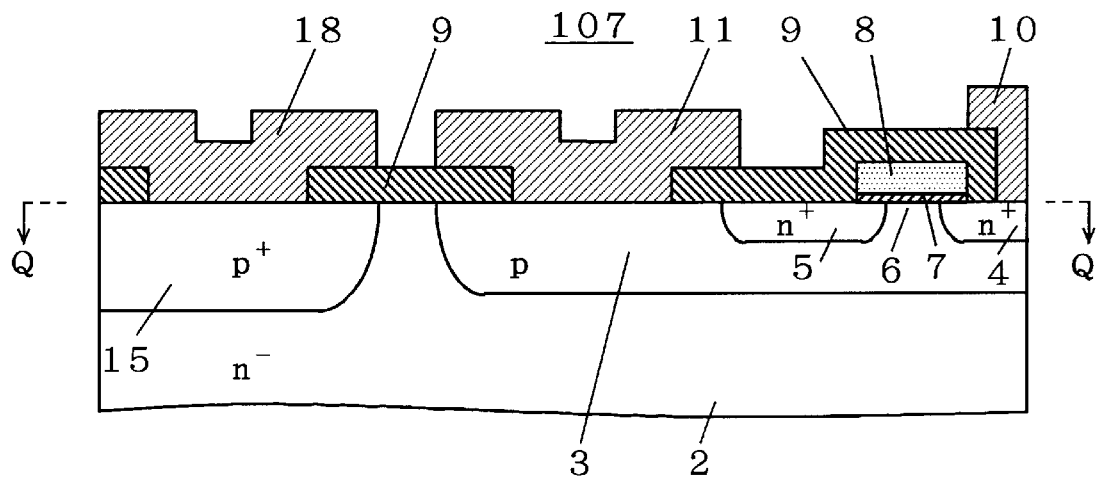
FIG. 35 is a front sectional view in the vicinity of an end portion of a cell region of a device of a modification (2).
Figure 36:
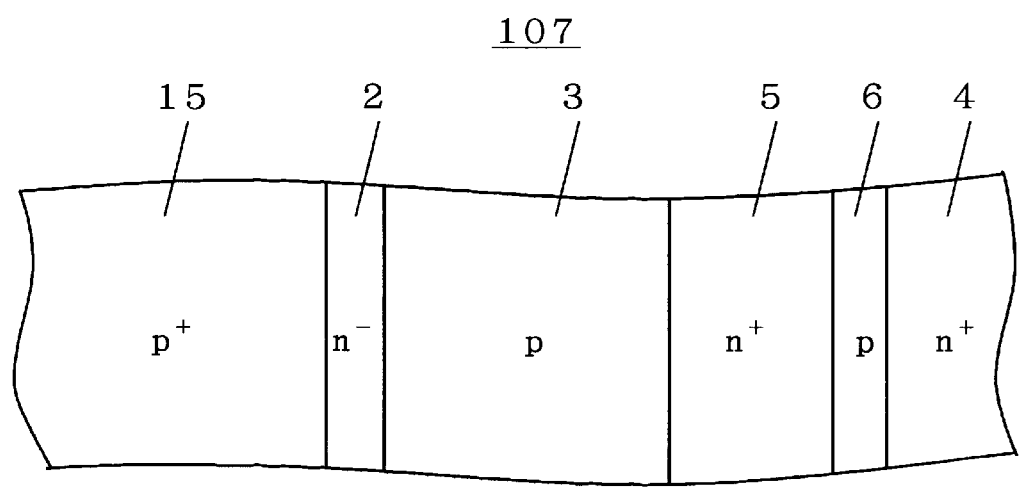
FIG. 36 is a sectional view of the device of the modification (2) along a Q—Q cutting-plane line.
Figure 37:
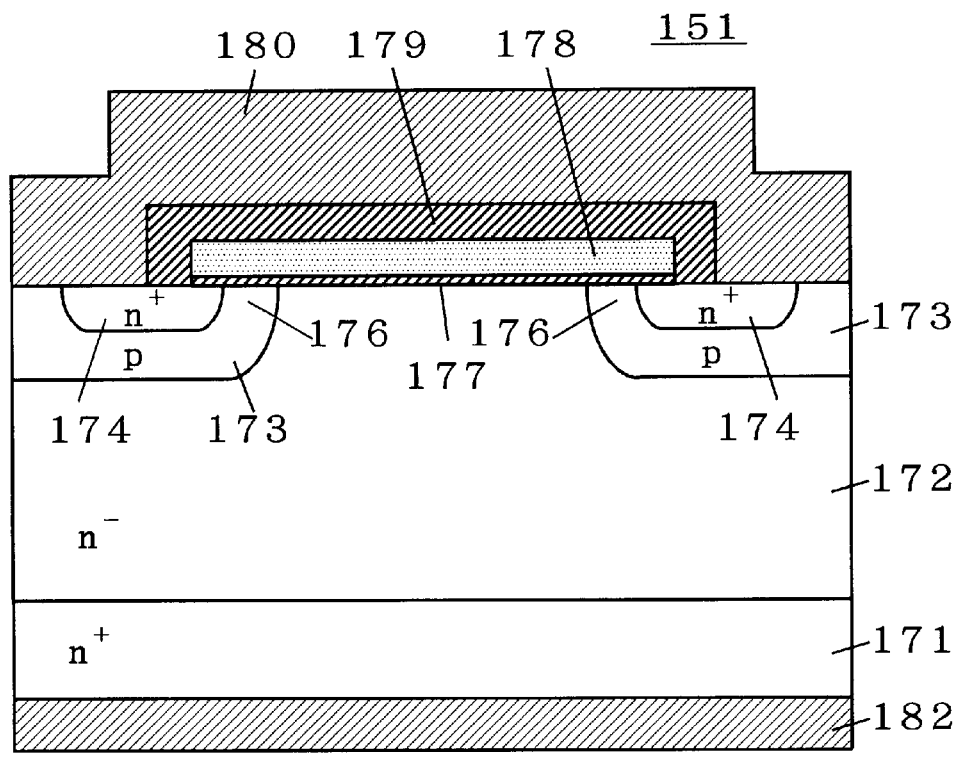
FIG. 37 is a front sectional view of a conventional MOS.
Figure 38:
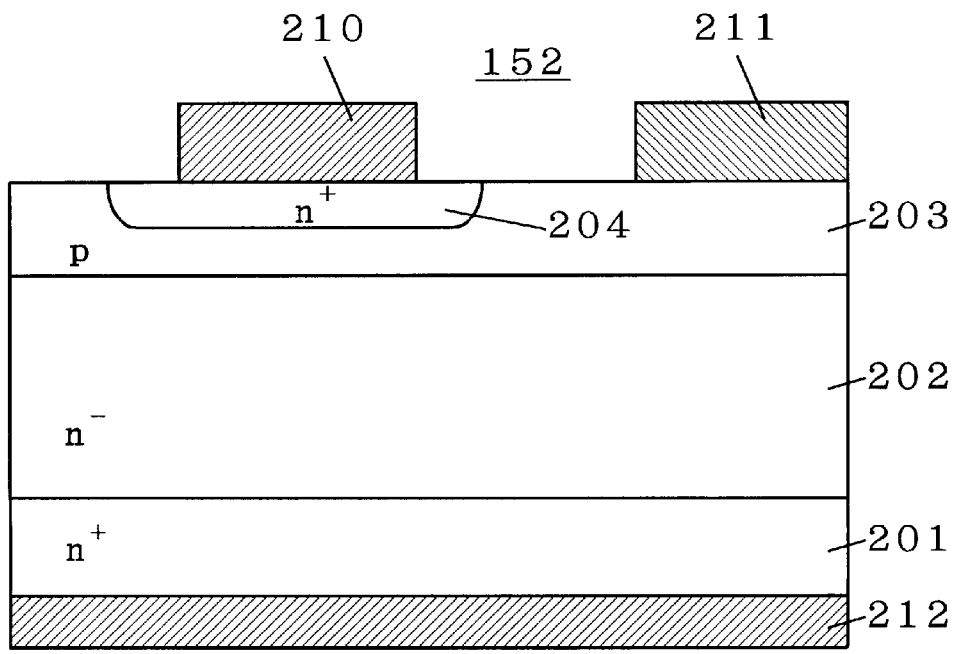
FIG. 38 is a front sectional view of a conventional BIP.
Figure 39:
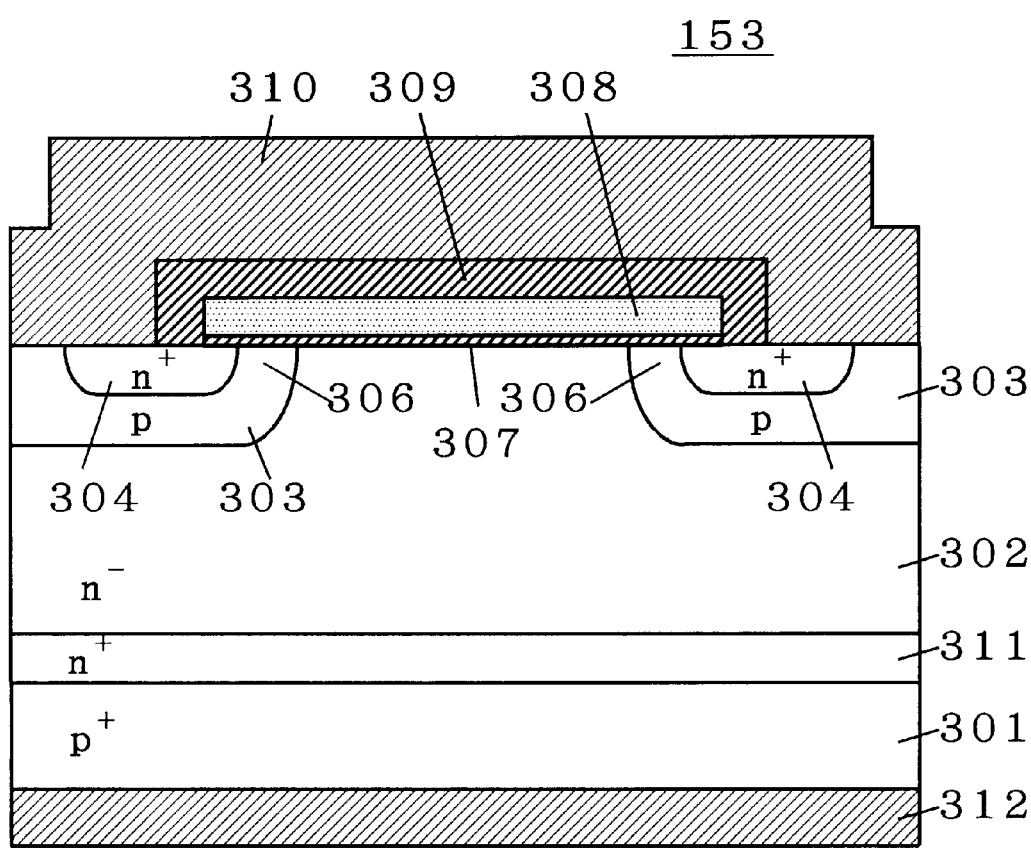
FIG. 39 is a front sectional view of a conventional IGBT.

(2) FIG. 35 is a sectional view of a transistor of a modification 2. An upper surface of this transistor 107 is also shown by the plan view of FIG. 2, similarly to the transistors 101 to 106. The section of FIG. 35 corresponds to a section along W—W cutting-plane line in FIG. 2. FIG. 36 is a sectional view along a Q—Q cutting-plane line in FIG. 35. Namely, these FIG. 35 and FIG. 36 are compared with FIG. 6 and FIG. 7 related to the transistor 101 respectively.

As shown in FIG. 35 and FIG. 36, a second emitter layer 5 is formed on a position closest to an external region ER in a first emitter layer 4 and the second emitter layer 5, and following this, a base electrode 11 is arranged on a position closest to the external region ER in an emitter electrode 10 and the base electrode 11 in the transistor 107. On the other hand, a p region 15 must be maintained at the same potential as the emitter electrode 10, and hence an electrode 18 is connected to a surface of the p region 15. The electrode 18 is connected to an emitter pad 31 (FIG. 2), and electrically connected with the emitter electrode 10 through the emitter pad 31.

The electrode 18 maintained at the same potential as the emitter electrode 10 and the base electrode 11 adjacent thereto are electrically isolated from each other by an interlayer isolation film 9. Namely, an isolation region is provided between the electrode 18 connected to the p region 15 and the adjacent base electrode 11.

Also in this transistor 107, reduction of an ON-state voltage and improvement of a turn-off characteristic are compatibly implemented. In the transistor 101 in which the first emitter layer 4 is formed on the position closest to the external region ER and the emitter electrode 10 is arranged on the position closest to the external region ER following this, however, there is such an advantage that is not necessary to set an isolation region and miniaturization of the device is facilitated by this, as described in the embodiment 1.

(3) Each of the transistors 101 to 107 described above has been formed as an n-channel type transistor, i.e., such a transistor that the channel region 6 is inverted to an n type. However, p-channel type transistors obtained by inverting the conductivity types of respective semiconductor layers are also formable with respect to their transistors, and attain effects similar to the transistors 101 to 107 respectively.

I claim:

1. A transistor comprising:
   a first conductivity type first semiconductor layer defining a first major surface and a second major surface;
   a second conductivity type second semiconductor layer formed in said first major surface of said first semiconductor layer;
   a first conductivity type third semiconductor layer selectively formed in a surface of said second semiconductor layer;
   a first conductivity type fourth semiconductor layer selectively formed in said surface of said second semiconductor layer, in isolation from said third semiconductor layer;
   an insulating film formed on a region held between said third and fourth semiconductor layers in an exposed surface of said second semiconductor layer;
   a first control electrode (8) formed on said insulating film;
   a second control electrode formed on a region in said exposed surface of said semiconductor layer different from said region on which said insulating film is formed;
   a first main electrode formed on a surface of said third semiconductor layer; and
   a second main electrode being formed on said second major surface of said first semiconductor layer.

2. The transistor in accordance with claim 1, wherein said first main electrode and said second control electrode are so formed as to hold said first control electrode and said fourth semiconductor layer therebetween.

3. The transistor in accordance with claim 1, wherein said third and fourth semiconductor layers are formed in the shape of stripes, and to be parallel to each other.

4. The semiconductor in accordance with claim 1, wherein
   a first component not flowing through said fourth semiconductor layer is suppressed lower than a second component flowing through said fourth semiconductor layer in a main current flowing across said first and second main electrodes.

5. The semiconductor in accordance with claim 4, wherein
   said fourth semiconductor layer is more deeply formed than said third semiconductor layer.

6. The semiconductor in accordance with claim 4, wherein
   a second conductivity type fifth semiconductor layer higher in impurity concentration than said second semiconductor layer is formed adjacently to a bottom portion of said third semiconductor layer.

7. The semiconductor in accordance with claim 6, wherein
   said fifth semiconductor layer is formed more deeply than said second semiconductor layer.

8. The semiconductor in accordance with claim 1, further comprising a second conductivity type sixth semiconductor layer selectively formed over a region held between said first main electrode and said first control electrode up to a part a region facing said first main electrode in said surface of said third semiconductor layer,
   said third semiconductor layer being exposed in a region held between a surface of said sixth semiconductor layer and an exposed surface of said second semiconductor layer, while being opposed to said first control electrode in said region.

9. The semiconductor in accordance with claim 1, wherein
   said second semiconductor layer is selectively formed on a region enclosed with an external region along an outer periphery in said first major surface of said first semiconductor layer,
   said transistor further comprising:
   a second conductivity type seventh semiconductor layer so selectively formed in said external region as to enclose said second semiconductor layer, and
   a third main electrode formed on a surface of said seventh semiconductor layer and electrically connected with said first main electrode.

10. The semiconductor in accordance with claim 9, wherein
    said first and third main electrodes are formed on said first major surface while integrally coupling with each other.

11. The semiconductor in accordance with claim 9, wherein
    said seventh semiconductor layer is formed more deeply than said second semiconductor layer.

12. The semiconductor in accordance with claim 1, wherein
    said first semiconductor layer comprises an eighth semiconductor layer joined with said second semiconductor layer and a ninth semiconductor layer exposed on said second major surface,
    said ninth semiconductor layer being higher than said eighth semiconductor layer in an impurity concentration.

13. A method of fabricating a transistor comprising the following steps (a) to (i);
    (a) a step of preparing a first conductivity type semiconductor substrate as a first semiconductor layer, said semiconductor substrate defining a first major surface and a second major surface;
    (b) a step of forming a second conductivity type second semiconductor layer by introducing a second conductivity type impurity into said first major surface of said first semiconductor layer;
    (c) a step of selectively forming an insulating film on a surface of said second semiconductor layer;
    (d) a step of forming a first control electrode on said insulating film;
    (e) a step of selectively forming a first conductivity type third semiconductor layer by employing said first control electrode as a part of a mask and selectively introducing a first conductivity type impurity into said surface of said second semiconductor layer;

(f) a step of selectively forming a first conductivity type fourth semiconductor layer in isolation from said third semiconductor layer by employing said first control electrode as a part of a mask and selectively introducing a first conductivity type impurity into said surface of said second semiconductor layer;

(g) a step of forming a second control electrode on a region in an exposed surface of said second semiconductor layer different from a region on which said insulating film is formed;

(h) a step of forming a first main electrode on a surface of said third semiconductor layer; and (i) a step of forming a second main electrode on said second major surface of said first semiconductor layer.

14. The method of fabricating a transistor in accordance with claim 13, wherein said step (e) and said step (f) share the following single step (j):

(j) a step of simultaneously forming said third and fourth semiconductor layers by selectively implanting a first conductivity type impurity into said surface of said second semiconductor layer while using a single screen covering said first major surface and selectively having an opening part corresponding to said third and fourth semiconductor layers as a mask and thereafter diffusing the same.

15. The method of fabricating a transistor in accordance with claim 13, wherein said step (e) comprises:

(e-1) a step of selectively implanting a first conductivity type impurity into said surface of said second semiconductor layer while using a screen covering said first major surface and selectively defining an opening part corresponding to said fourth semiconductor layer in cooperating with said first control electrode as a mask and thereafter diffusing the same, said step (f) comprises:

(f-1) a step of selectively implanting a first conductivity type impurity into said surface of said second semiconductor layer while using a screen covering said first major surface and selectively defining an opening part corresponding to said third semiconductor layer in cooperation with said first control electrode as a mask after said step (e-1), and said step (e) and said step (f) further share the following single step (k):

(k) a step of forming said third and fourth semiconductor layers so that said fourth semiconductor layer becomes deeper than said third semiconductor layer by simultaneously diffusing said impurity diffused in said step (e-1) and said impurity implanted in said step (f-1) after said step (f-1).

16. The fabricating a transistor in accordance with claim 13, further comprising:

(l) a step of selectively forming a second conductivity type fifth semiconductor layer to be deeper than said third semiconductor layer and higher in impurity concentration than said second semiconductor layer by selectively introducing a second conductivity type impurity into a region in said first major surface in which said third semiconductor layer is to be formed after said step (a) or said step (b).

17. The method of fabricating a transistor in accordance with claim 13, further comprising:

(m) a step of selectively forming a second conductivity type sixth semiconductor layer by employing said first control electrode as a part of a mask and selectively introducing a second conductivity type impurity into said surface of said third semiconductor layer not to reach the exposed surface of said second semiconductor layer opposed to said first control electrode after said steps (e) and (f), said step (h) comprising:

(h-1) a step of forming said first main electrode on both of an exposed surface of said third semiconductor layer and a surface of said sixth semiconductor layer.

18. The method of fabricating a transistor in accordance with claim 13, further comprising:

(n) a step of selectively forming a second conductivity type seventh semiconductor layer to enclose said second semiconductor layer by selectively introducing a second conductivity type impurity into an external region along an outer periphery in said first major surface after said step (a) or said step (b), and (o) a step of forming a third main electrode being electrically connected with said first main electrode on said seventh semiconductor layer.

19. The method of fabricating a transistor in accordance with claim 18, wherein said step (n) comprises:

(n-1) a step of selectively implanting into and diffusing in said external region along said outer periphery in said first major surface after said step (a) and in advance of said step (b), said step (b) comprises:

(b-1) a step of implanting a second conductivity type impurity into said first major surface of said first semiconductor layer, and said step (n) and said step (b) further share the following single step (p):

(p) a step of forming said second and seventh semiconductor layers so that said seventh semiconductor layer becomes deeper than said second semiconductor layer by simultaneously diffusing said impurity diffused in said step (n-1) and said impurity implanted in said step (b-1) after said step (b-1).

20. The method of fabricating a transistor in accordance with claim 16, wherein said step (l) comprises:

(l-1) a step of forming said fifth semiconductor layer and simultaneously selectively forming a second conductivity type seventh semiconductor layer to enclose said second semiconductor layer by selectively introducing a second conductivity type impurity while using a screen covering said first major surface and selectively defining opening parts in a region in which said third semiconductor layer is to be formed and an external region along an outer periphery as a mask after said step (a) or said step (b).

* * * * *